(12) United States Patent
Kim

(10) Patent No.: US 7,955,879 B2
(45) Date of Patent: Jun. 7, 2011

(54) METHOD OF FORMING LED SEMICONDUCTOR DEVICE HAVING ANNEALED ENCAPSULANT LAYER AND ANNEALED LUMINESCENCE CONVERSION MATERIAL LAYER

(75) Inventor: YuSik Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/380,134

(22) Filed: Feb. 24, 2009

(65) Prior Publication Data

US 2009/0278151 A1   Nov. 12, 2009

(30) Foreign Application Priority Data

May 7, 2008 (KR) .................. 10-2008-0042424

(51) Int. Cl.
H01L 33/00 (2010.01)
H01L 21/00 (2010.01)

(52) U.S. Cl. .................. 438/29; 257/98; 257/E21.002

(58) Field of Classification Search ............ 438/29; 257/98, 100, E21.002, E33.059, E33.07
See application file for complete search history.

(56) References Cited

U.S. PATENT DOCUMENTS

| | | | |
|---|---|---|---|
| 5,795,626 A * | 8/1998 | Gabel et al. ............ 427/458 |
| 5,962,971 A | 10/1999 | Chen |
| 6,650,044 B1 | 11/2003 | Lowery |
| 6,858,456 B2 | 2/2005 | Noguchi et al. |
| 7,126,162 B2 | 10/2006 | Reeh et al. |
| 7,279,346 B2 | 10/2007 | Andrews et al. |
| 2002/0084749 A1 | 7/2002 | Ayala et al. |
| 2007/0012940 A1 | 1/2007 | Suh et al. |
| 2007/0096113 A1 | 5/2007 | Inoshita et al. |
| 2007/0189007 A1 * | 8/2007 | Nishimoto et al. ........ 362/227 |
| 2008/0023721 A1 | 1/2008 | Lee et al. |
| 2009/0039762 A1 * | 2/2009 | Park et al. .............. 313/502 |
| 2009/0309116 A1 * | 12/2009 | Kato et al. ............... 257/98 |

FOREIGN PATENT DOCUMENTS

| | | | |
|---|---|---|---|
| JP | 2003-105207 | * | 4/2003 |
| JP | 2005-183727 | | 7/2005 |
| JP | 2005-191197 | | 7/2005 |
| JP | 2005-217094 | | 8/2005 |
| JP | 2007-116131 | | 5/2007 |
| JP | 2007-300043 | | 11/2007 |
| JP | 2007-335798 | | 12/2007 |
| KR | 20040044701 A | | 5/2001 |
| KR | 10-2005-0090505 A | | 9/2005 |
| KR | 10-2006-0023663 A | | 3/2006 |
| KR | 100797968 A | | 3/2006 |
| KR | 10-0616682 | * | 8/2006 |
| KR | 10-0616682 B1 | | 8/2006 |
| KR | 100665219 B | | 12/2006 |
| KR | 1020070098154 A | | 5/2007 |
| KR | 10-2007-0098195 A | | 10/2007 |

* cited by examiner

*Primary Examiner* — Hsien-ming Lee
*Assistant Examiner* — Walter H Swanson
(74) *Attorney, Agent, or Firm* — Mills & Onello, LLP

(57) ABSTRACT

In a method of forming an LED semiconductor device, and in an LED semiconductor device, an LED is provided on a substrate. A first encapsulant material layer is provided on the LED, and the first encapsulant material layer is firstly annealed. A luminescence conversion material layer is provided on the firstly annealed first encapsulant material layer, and the first encapsulant material layer and the luminescence conversion material layer and secondly annealed.

38 Claims, 21 Drawing Sheets

METHOD OF FORMING LED SEMICONDUCTOR DEVICE HAVING ANNEALED ENCAPSULANT LAYER AND ANNEALED LUMINESCENCE CONVERSION MATERIAL LAYER

RELATED APPLICATIONS

This application claims priority under 35 U.S.C. 119 to Korean Patent Application No. 10-2008-0042424, filed on May 7, 2008, the content of which is incorporated herein by reference in its entirety.

BACKGROUND

Light emitting diodes (LEDs) enjoy widespread use in modern electronic devices. They are capable of emitting high-power light and offer more efficient power consumption, higher reliability, greater durability, and longer life, as compared to their conventional counterparts, including fluorescent lamps, incandescent bulbs, and halogen lamps. In addition, owing to their relatively small size, they can be configured in relatively small form factors.

In a conventional LED, a forward bias is applied to a p-n junction, causing holes in the p-type semiconductor material to recombine with electrons in the n-type semiconductor material. As a result of the recombination, optical energy is emitted at a wavelength that corresponds to the bandgap of the p-n junction.

For many LED applications, it is commonly desired to generate white light. There are a number of approaches for accomplishing this. In one approach, LEDs that generate red, green, and blue light, or LEDs that generate blue and yellow light, are combined in a single package to generate white light. This approach can lead to bulky packaging and complicated manufacturing procedures, since it requires the formation, electrical connection, and packaging of multiple LEDs in a fixed area.

In another approach, the output of a blue LED is made to be incident on a yellow phosphorescent material to generate a white output light as a result of the phosphorescent reaction. Alternatively, the output of an ultraviolet LED is made to be incident on a phosphorescent material including red, green and blue phosphorescent particles to generate a white output light as a result of the phosphorescent reaction. In these approaches, it can be difficult to control the quality of the white output light, since it depends highly on the concentration of the phosphorescent material. For example, in conventional approaches, the phosphorescent material is commonly mixed into a resin material that encases the LED in the package. This approach suffers from low color repeatability and therefore low reliability, since it is difficult to control the concentration of the phosphorescent material once it is mixed with the resin carrier.

SUMMARY OF THE INVENTION

Embodiments of the present invention are directed to light emitting units, packages and systems employing such light emitting units, and methods of manufacturing the same, that address and overcome the limitations associated with conventional devices and methods. Specifically, the devices, systems and methods in accordance with the present invention provide for high color repeatability in the resulting LED devices, while reducing the amount of luminescence conversion material needed, thereby reducing fabrication costs. In particular, the transmittance and conversion efficiency of the resulting LED devices can be optimized by controlling a thickness of a luminescence conversion material layer present in the devices where wavelength conversion of optical energy occurs.

In one aspect, a method of forming an LED semiconductor device comprises: providing an LED on a substrate; providing a first encapsulant material layer on the LED; first annealing the first encapsulant material layer; providing a luminescence conversion material layer on the firstly annealed first encapsulant material layer; and second annealing the first encapsulant material layer and the luminescence conversion material layer.

In one embodiment, the luminescence conversion material layer consists essentially of a luminescence conversion material.

In another embodiment, providing the luminescence conversion material layer on the firstly annealed first encapsulant material layer comprises providing the luminescence conversion material layer to a thickness that is selected to determine a resultant transmittance of optical energy that is emitted from the LED semiconductor device.

In another embodiment, the method further comprises controlling a thickness of the luminescence conversion material layer by controlling process conditions of the first annealing of the first encapsulant material layer.

In another embodiment, the method further comprises controlling a thickness of the luminescence conversion material layer by applying a physical pressure to the first encapsulant material layer.

In another embodiment, the first annealing is performed under first process conditions, and the second annealing is perfoinied under second process conditions, and the second process conditions are independent of the first process conditions.

In another embodiment, the first process conditions of the first annealing result in a soft curing of the first encapsulant material layer and the second process conditions of the second annealing result in a hard curing of the first encapsulant material layer.

In another embodiment, the method further comprises providing a second encapsulant material layer on the luminescence conversion material layer.

In another embodiment, the second encapsulant material layer is substantially transparent to optical energy at wavelengths emitted by the LED.

In another embodiment, providing a second encapsulant material layer on the luminescence conversion material layer occurs prior to second annealing the first encapsulant material layer and the luminescence conversion material layer.

In another embodiment, providing a second encapsulant layer on the luminescence conversion material layer occurs after second annealing the second encapsulant material layer and the luminescence conversion material layer.

In another embodiment, the first encapsulant material layer is substantially transparent to optical energy at wavelengths emitted by the LED.

In another embodiment, the method further comprises selectively removing a portion of the luminescence conversion material layer after providing the luminescence conversion material layer on the firstly annealed first encapsulant material layer, wherein selectively removing removes a portion of the luminescence conversion material layer that is not adhered to the firstly annealed first encapsulant material layer.

In another embodiment, the method further comprises providing a filter on the luminescence conversion material layer.

In another embodiment, the method further comprises providing one or more lenses on the luminescence conversion material layer.

In another embodiment, providing a first encapsulant material layer on the LED further comprises providing a first encapsulant material layer on the substrate.

In another embodiment, providing a first encapsulant material layer on the LED further comprises providing the first encapsulant material layer exclusively on the LED and the substrate and patterning the first encapsulant material so that the first encapsulant material remains exclusively on the LED.

In another embodiment, providing the luminescence conversion material layer on the firstly annealed first encapsulant material layer further comprises providing the luminescence conversion material layer on the substrate; and the method further comprises: selectively removing a portion of the luminescence conversion material layer after providing the luminescence conversion material layer on the firstly annealed first encapsulant material layer and the substrate, wherein selectively removing removes a portion of the luminescence conversion material layer that is not adhered to the firstly annealed first encapsulant material layer.

In another embodiment, the method further comprises providing a second encapsulant layer on the luminescence conversion material layer and on the substrate.

In another embodiment, the method further comprises shaping the second encapsulation layer to have a convex or concave shape.

In another embodiment, the method further comprises providing a filter on the second encapsulation layer.

In another embodiment, luminescence conversion material of the luminescence conversion material layer comprises a phosphor material.

In another aspect, an LED semiconductor device comprises: an LED on a substrate; a first encapsulant material layer on the LED; and a luminescence conversion material layer consisting essentially of a luminescence conversion material on the first encapsulant material layer, the luminescence conversion material layer being of a thickness that is selected to determine a resultant transmittance of optical energy that is emitted from the LED.

In one embodiment, the first encapsulant material layer is first annealed under first process conditions to have a first hardness prior to application of the luminescence conversion material layer and wherein the thickness of the luminescence conversion material layer is determined as a result of the first hardness; and the first encapsulant material layer and the luminescence conversion material layer are second annealed under second process conditions, that are independent of the first process conditions.

In another embodiment, the first process conditions of the first annealing result in a soft curing of the first encapsulant material layer and the second process conditions of the second annealing result in a hard curing of the first encapsulant material layer.

In another embodiment, the thickness of the luminescence conversion material layer is determined by controlling process conditions of the first annealing of the first encapsulant material layer.

In another embodiment, the thickness of the luminescence conversion material layer is determined by applying a physical pressure to the first encapsulant material layer.

In another embodiment, the device further comprises a second encapsulant material layer on the luminescence conversion material layer.

In another embodiment, the second encapsulant material layer is substantially transparent to optical energy at wavelengths emitted by the LED.

In another embodiment, the first encapsulant material layer is substantially transparent to optical energy at wavelengths emitted by the LED.

In another embodiment, the device further comprises a filter on the luminescence conversion material layer.

In another embodiment, the device further comprises one or more lenses on the luminescence conversion material layer.

In another embodiment, the first encapsulant material layer is further on the substrate.

In another embodiment, the first encapsulant material layer is exclusively present on the LED and not on the substrate.

In another embodiment, the device further comprises a second encapsulation layer on the luminescence conversion material layer and on the substrate.

In another embodiment, the second encapsulation layer is shaped to have a convex or concave shape.

In another embodiment, the device further comprises a filter on the second encapsulation layer.

In another embodiment, the luminescence conversion material comprises a phosphor material.

In another aspect, a system comprises: a controller that generates LED activation signals; and a plurality of LED semiconductor devices, the LED semiconductor devices receiving LED activation signals from the controller, each LED semiconductor device comprising: an LED on a substrate; a first encapsulant material layer on the LED; and a luminescence conversion material layer consisting essentially of a luminescence conversion material on the first encapsulant material layer, the luminescence conversion material layer being of a thickness that is selected to determine a resultant transmittance of optical energy that is emitted from the LED, when the LED is activated by the LED activation signals.

BRIEF DESCRIPTION OF THE DRAWINGS

The foregoing and other objects, features and advantages of the embodiments of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention. In the drawings.

DETAILED DESCRIPTION OF EMBODIMENTS

Embodiments of the present invention will now be described more fully hereinafter with reference to the accompanying drawings, in which preferred embodiments of the invention are shown. This invention may, however, be embodied in different forms and should not be construed as limited to the embodiments set forth herein. Like numbers refer to like elements throughout the specification.

It will be understood that, although the terms first, second, etc. are used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "on" or "connected" or "coupled" to another element, it can be directly on or connected or coupled to the other element or intervening elements can be present. In contrast, when an element is referred to as being "directly on" or "directly connected" or "directly coupled" to another element, there are no intervening elements present. Other words used to describe the relationship between elements should be interpreted in a like fashion (e.g., "between" versus "directly between," "adjacent" versus "directly adjacent," etc.). When an element is referred to herein as being "over" another element, it can be over or under the other element, and either directly coupled to the other element, or intervening elements may be present, or the elements may be spaced apart by a void or gap.

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

FIGS. 1A-1E are cross-sectional diagrams illustrating the formation of an LED, in accordance with an embodiment of the present invention. FIG. 2 is a flow diagram illustrating the steps for forming an LED, in accordance with an embodiment of the present invention.

Figure 1A:
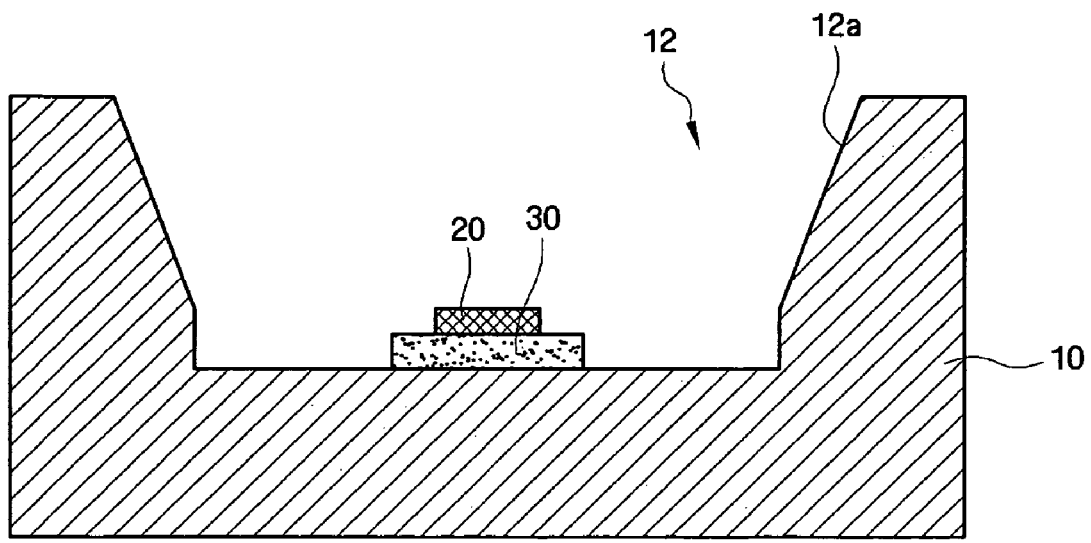
FIGS. 1A-1E are cross-sectional diagrams illustrating the formation of an LED structure, in accordance with an embodiment of the present invention.
Figure 2:
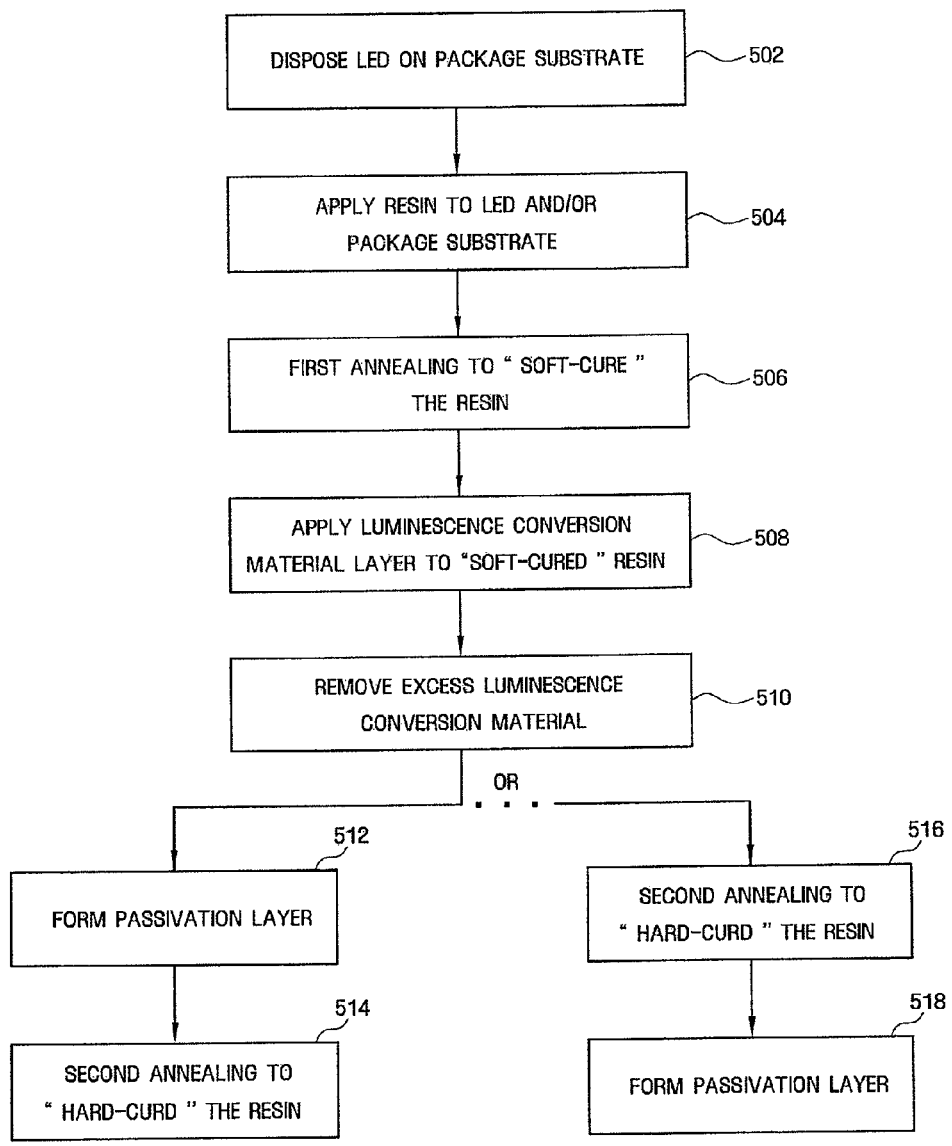
FIG. 2 is a flow diagram illustrating the steps for forming an LED, in accordance with an embodiment of the present invention.

Referring to FIG. 1A and step 502 of FIG. 2, a package substrate 10 is prepared to include a slot or opening 12. The package substrate 10 can include an optional sub-mount 30 in a central region of the package for locating an LED 20. The LED 20 can be mounted to the optional sub-mount 30, or, in other embodiments, mounted directly to the package substrate 10. In various embodiments, the LED can be configured to generate optical energy, for example optical energy at ultraviolet or blue wavelengths. The slot 12 can be configured with tapered sidewalls 12a as shown to increase the light emitting efficiency of the resulting package.

Figure 1B:
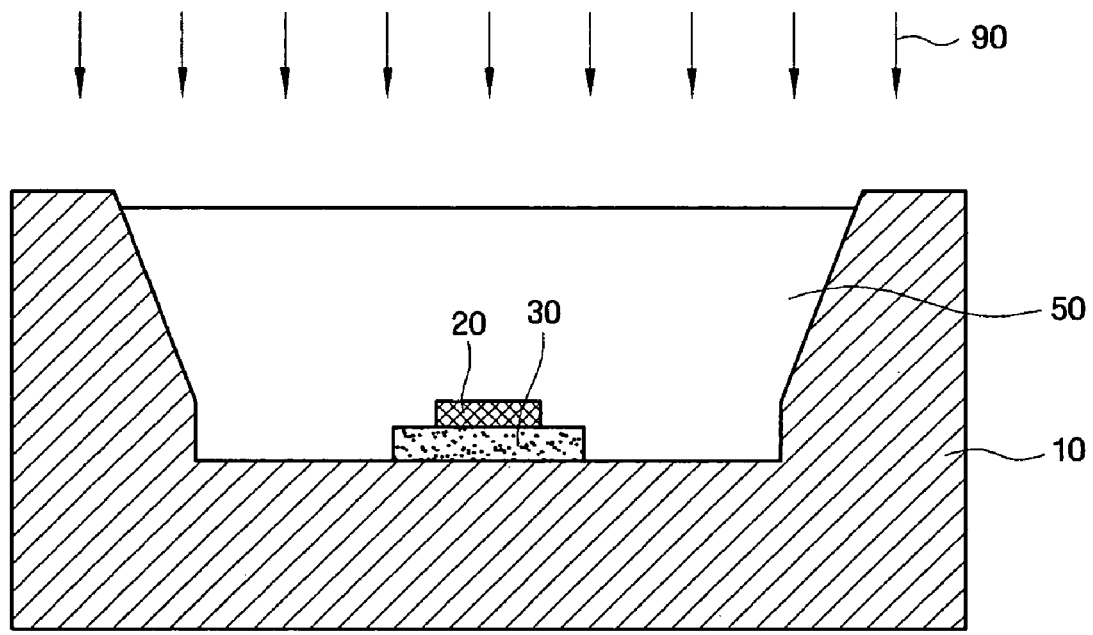

Referring to FIG. 1B and step 504 of FIG. 2, a first encapsulant 50, or resin layer, is provided in the opening 12. In this embodiment, the first encapsulant 50 is provided at least to a level or depth that coats or covers the LED 20. The first encapsulant 50 can comprise a material that is transparent to the optical energy at the wavelengths emitted by the LED 20. In various embodiments, the first encapsulant 50 can comprise at least one of epoxy, silicone, rigid silicone, urethane, oxethane, acryl, polycarbonate, polyimide, and a mixture of at least two of these, suitable for protecting the underlying LED 20.

Referring to FIG. 1B and step 506 of FIG. 2, a first annealing 90 is performed on the resulting structure, including the first encapsulant 50. The process conditions of the first annealing 90, including temperature, pressure, and duration, are selected so that a soft-curing of the first encapsulant 50 is achieved. In a soft-cured state, the first encapsulant 50 is no longer in a fluid state and is not fully hardened. Instead, the first encapsulant 50 is made to be sufficiently hard by the first annealing 90 so that when a luminescence conversion material, such as a phosphor material, is later applied to a top surface of the first encapsulant 50, the luminescence conversion material does not penetrate substantially into the first encapsulant 50, but rather, the luminescence conversion material bonds to a top surface, or top region, of the first encapsulant 50. In an example where the first encapsulant 50 comprises a silicone epoxy material in a 1 mm×1 mm top-view-type LED package, a first annealing process performed at 150 C-200 C, at atmospheric pressure, and for a duration of 80-120 seconds was found to sufficiently soft-cure the first encapsulant 50. The process conditions of the first annealing 90 vary with the type of first encapsulant and the volume of first encapsulant 50 in the opening 12; in general, a larger volume of first encapsulant requires a longer annealing time.

Figure 1C:
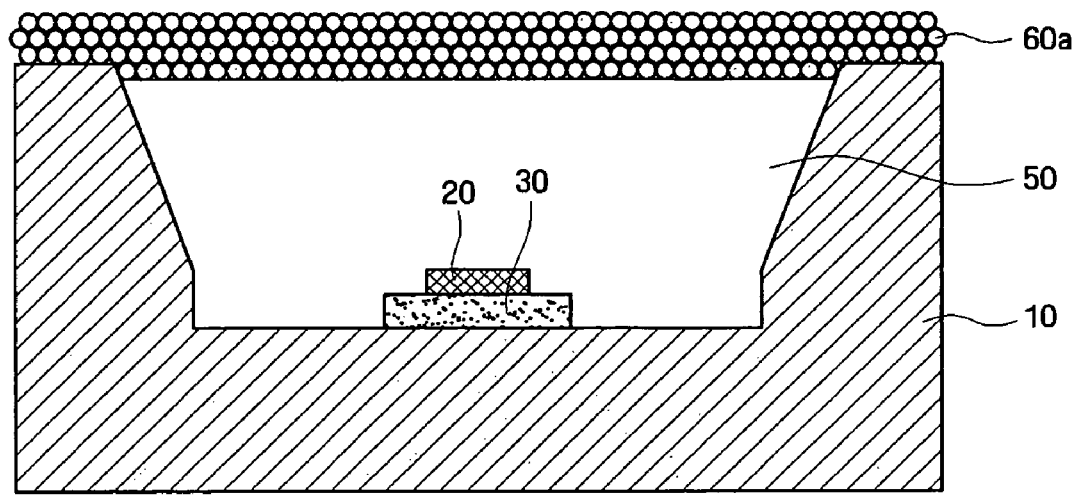
Figure 3:
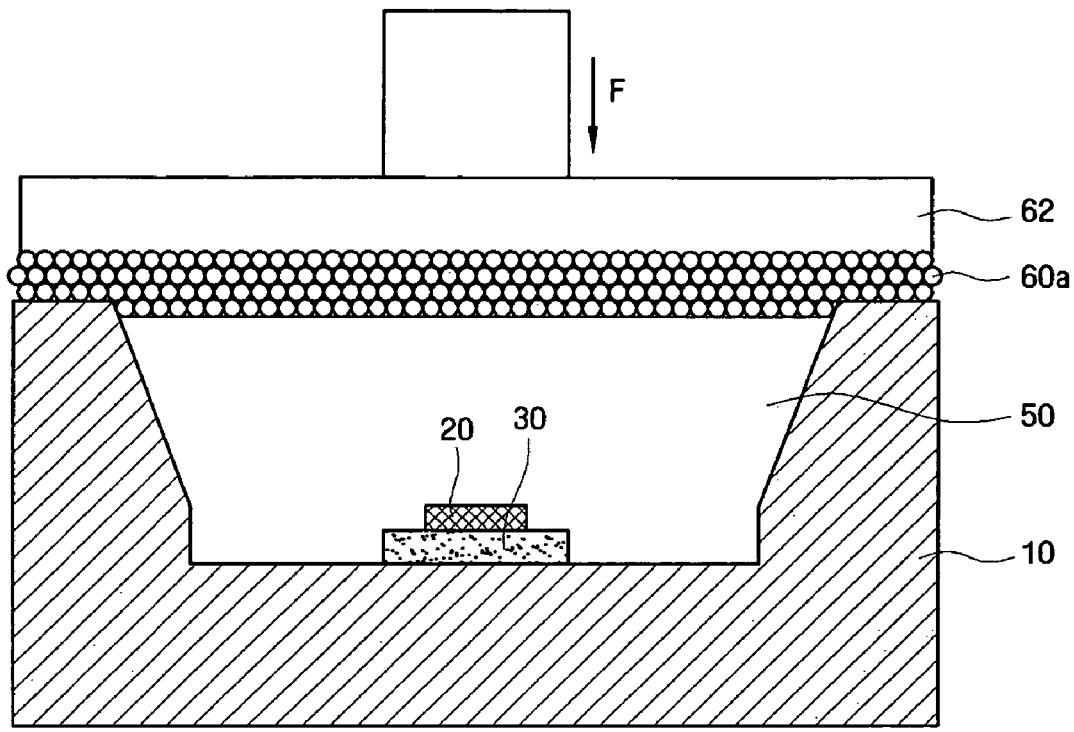
FIG. 3 is a conceptual illustration of a physical force provided to apply the luminescence conversion material to the soft-cured encapsulant, in accordance with an embodiment of the present invention.

Referring to FIG. 1C and step 508 of FIG. 2, a luminescence conversion material 60a is applied to the resulting soft-cured first encapsulant 50. In one embodiment, the luminescence conversion material 60a comprises a powder-type substance that is applied using a deposition process. The luminescence conversion material 60a can be applied to the soft-cured first encapsulant 50 under a physical force, such as a thermal stress or mechanical pressure so that a lower portion of the luminescence conversion material 60a is physically pushed into, or bonded to, the upper surface of the soft-cured first encapsulant 50. FIG. 3 is a conceptual illustration of a physical force F provided by member 62 to apply the luminescence conversion material 60a to the soft-cured first encapsulant 50. Since the first encapsulant 50 is in a soft-cured state, and is not hardened, the upper surface thereof is receptive of the luminescence conversion material 60a, and particles of the luminescence conversion material 60a bond thereto.

The luminescence conversion material 60a operates to absorb first optical energy at first wavelengths emitted by the LED and converts the absorbed optical energy to second optical energy having second wavelengths that are different than the first wavelengths. For example, to generate second optical energy at white-light wavelengths, the first wavelength of the LED can be blue and the luminescence conversion material 60a can comprise yellow fluorescent material. To further increase the color rendering index (CRI) of the resulting package, red phosphor can be added to the luminescence conversion material 60a. In another case, second optical energy at white-light wavelengths can be generated where the first wavelength of the LED is ultraviolet by applying red/green/blue phosphor material to the luminescence conversion material 60a.

Figure 1D:
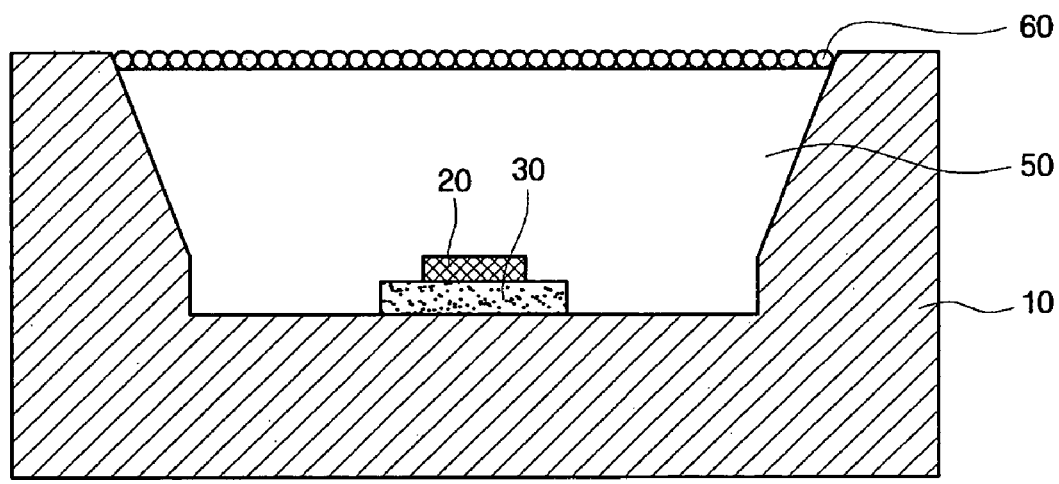

Referring to FIG. 1D and step 510 of FIG. 2, excess luminescence conversion material 60a is removed from the upper surface of the first encapsulant 50. This step can be performed, for example, by shaking or vibrating the resulting package in an upside-down position and allowing excess particles or material to be removed by gravity. In another technique, a gas stream under pressure, for example, an Ar, Ne, or $N_2$ gas stream, can be applied to the luminescence conversion material 60a to remove excess material from the upper surface of the first encapsulant 50. As a result, a luminescence conversion material layer 60 remains on an upper surface of the first encapsulant 50. The resulting luminescence conversion material layer 60 consists essentially of luminescence conversion material 60a because the material 60a is applied to the top surface of the first encapsulant 50, and is not applied as a mixture along with the material of the first encapsulant 50. The application of a luminescence conversion material layer 60 consisting essentially of luminescence conversion material 60a is distinguished from the conventional approaches for forming LED structures in that the luminescence conversion material layer 60 is not mixed directly with the resin, or first encapsulant, but instead is applied as a layer to a top surface of the soft-cured first encapsulant 50, as described above. The term "consisting essentially of" is intended to mean including primarily luminescence conversion material, but allowing for a certain low percentage of impurities or other materials to be present in the resulting luminescence conversion material layer 60.

It has been demonstrated experimentally that the thickness of the resulting luminescence conversion material layer 60 detellnines the conversion efficiency of the resulting device, where the conversion efficiency is the power ratio between the converted optical energy (i.e., the power of the light emitted at the second wavelength, or light converted as a result of passing through the luminescence conversion material layer 60) and the original optical energy (i.e., the power of the light emitted at the first wavelength, or the wavelength generated by the LED) for the optical energy emitted from the package. A higher conversion efficiency indicates that relatively more light is converted by the luminescence conversion material layer 60, and relatively less light at the first wavelength emitted by the LED is emitted from the package without conversion.

It has also been determined that the conversion efficiency of a device is directly related to the thickness of the luminescence conversion material layer 60, and an optimal conversion efficiency can be determined for a given device configuration. For example, if the luminescence conversion material layer 60 is too thin, then conversion efficiency decreases since optical energy at the first wavelength will pass through the luminescence conversion material layer 60 without conversion. At the same time, if the luminescence conversion material layer 60 is too thick, then conversion efficiency decreases since the amount of optical energy passing through the luminescence conversion material layer 60 with wavelength conversion and the first wavelength will decrease.

For similar reasons, it has also been determined that the thickness of the resulting luminescence conversion material layer 60 is directly related to the transmittance of the optical energy at the first wavelength of the resulting device, where the transmittance of a device is the power ratio between the optical energy of the light emitted by the LED at the first wavelength to the optical energy of the light passing through the luminescence conversion material layer 60 and emitted from the package at the first wavelength (i.e., unconverted light energy). It has been determined that since the transmittance of a device is directly related to the thickness of the luminescence conversion material layer 60, an optimal transmittance value can be determined for a given device configuration. For example, a thinner luminescence conversion material layer 60 results in a larger transmittance for the resulting device and a thicker luminescence conversion material layer 60 results in a smaller transmittance for the resulting device. The thickness of the luminescence conversion material can be determined based on a suitable transmittance range at a maximum conversion efficiency range, for example, a transmittance in a range of between about 5% and 10%. Other transmittance ranges are possible and may be desirable in certain applications.

Embodiments of the present invention allow for control of, and therefore optimization of, the thickness of the resulting luminescence conversion material layer 60 by controlling the hardness of the soft-cured first encapsulant 50. In general, a first encapsulant layer 50 that is cured to a lesser extent, is less hard, and is receptive to more luminescence conversion material 60a, resulting in a larger thickness in the resulting luminescence conversion material layer 60. Similarly, a first encapsulant layer 50 that is cured to a greater extent, is more hard, and is less receptive to luminescence conversion material 60a, resulting in reduced thickness in the resulting luminescence conversion material layer 60. The process conditions of the first annealing 90 are directly related to the resulting hardness of the first encapsulant layer 50 at the time of application of the luminescence conversion material 60a, and therefore, are directly related to the resulting thickness of the luminescence conversion material layer 60.

The resulting luminescence conversion material layer 60 is relatively thin, which confers a number of advantages. First, its thickness, being relatively thin, can be more readily controlled, which leads to greater color repeatability in the manufacturing process. Second, a relatively thin layer leads to improved thickness uniformity across the top surface of the first encapsulant layer, leading to more uniform in color output by a given device. Third, since relatively less material is used for the layer, material costs during fabrication can be reduced.

Figure 1E:
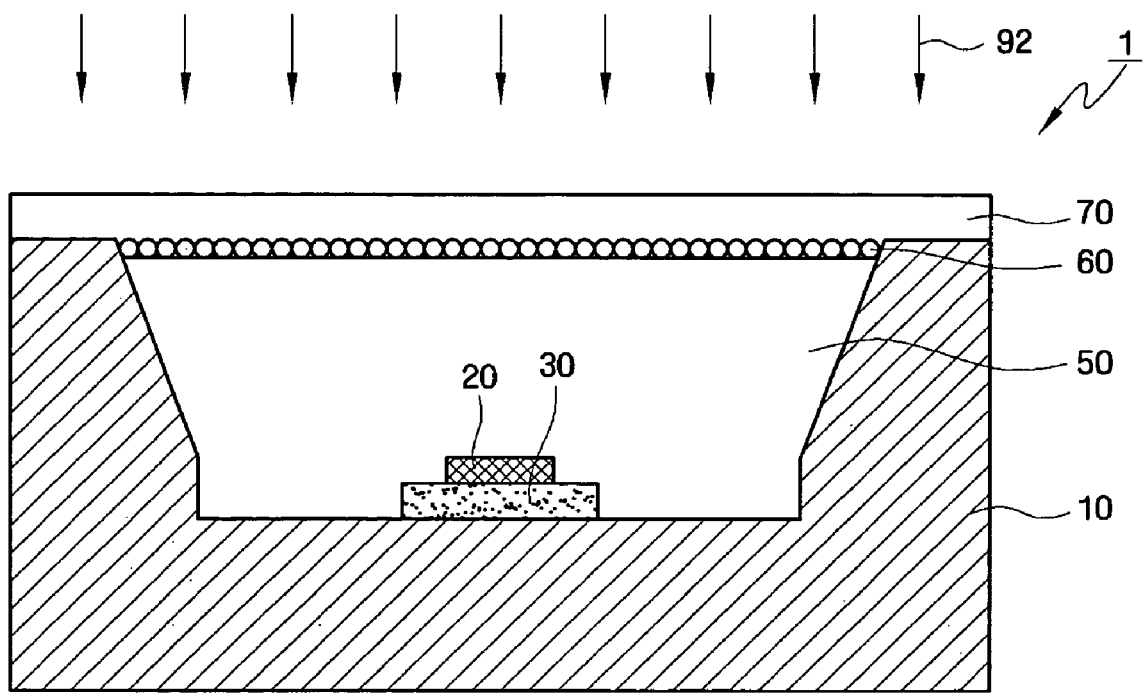

Referring to FIG. 1E and step 512 of FIG. 2, an optional second encapsulant layer 70, for example, a passivation layer, is formed on the resulting luminescence conversion material layer 60. The second encapsulant layer 70 operates to protect the underlying luminescence conversion material layer 60 from external environmental conditions, for example, from exposure to moisture. In various embodiments, the second encapsulant layer 70 can be formed to be substantially flat, or can be foamed to include various optical features, as will be described below in connection with further embodiments. The second encapsulant layer 70 can comprise, for example, a material that is transparent to the converted optical energy emitted by the luminescence conversion material layer 60 including at least one of epoxy, silicone, urethane, oxethane, acryl, polycarbonate, polyimide, and a mixture of at least two of these, suitable for protecting the underlying luminescence conversion material layer 60.

Referring to FIG. 1E and step 514 of FIG. 2, a second annealing process 92 is performed on the resulting structure, including the soft-cured first encapsulant 50, the luminescence conversion material layer 60, and the second encapsulant layer 70. The process conditions of the second annealing 92, including temperature, pressure, and duration, are selected so that a hard-curing of the first encapsulant 50 is achieved for the resulting LED device 1. In a hard-cured state, the first encapsulant 50 is substantially fully hardened. In an example where the first encapsulant comprises a silicone epoxy material in a 7 mm×7 mm top-view-type LED package (chip size is 1 mm×1 mm), a second annealing process performed at 150 C-200 C, at atmospheric pressure, for a duration of 5 to 30 minutes was found to sufficiently hard-cure the first encapsulant 50. In this example, the duration of the second annealing process as much longer than the duration of the first annealing process. Other process parameters such as temperature and/or pressure may be adjusted to achieve hard-curing of the resulting device. The process conditions of the second annealing 92 vary with the type of first encapsulant and the volume of first encapsulant 50 present; in general, a larger volume of first encapsulant requires a longer annealing time for the second annealing step.

Referring to FIG. 1E and steps 516 and 518 of FIG. 2, in another embodiment, the second annealing 92 can be optionally performed prior to formation of the second encapsulant layer 70.

Figure 4:
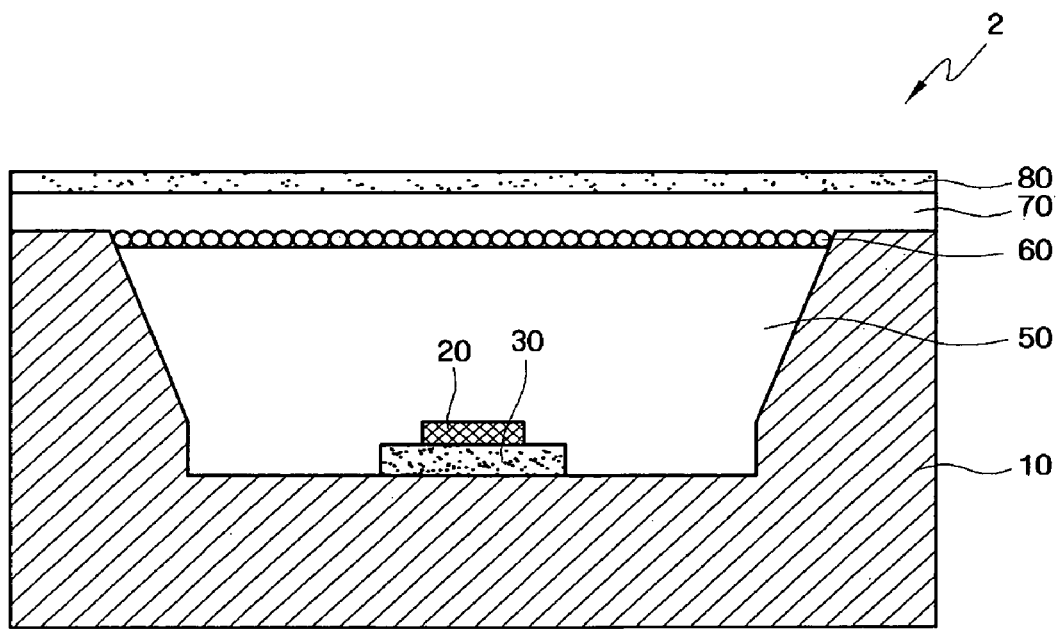
FIG. 4 is a cross-sectional diagram of another embodiment of the present invention.

FIG. 4 is a cross-sectional diagram of another embodiment of the present invention. Referring to FIG. 4, an optional wavelength filter 80 can be applied in the optical path of the emitted optical energy, for example, on the passivation layer 70, in order to filter the optical energy emitted by the device 2. In one example, the wavelength filter 80 can be applied to absorb optical energy that is emitted at a certain wavelength or wavelengths. In one example, the filter can be tuned to absorb the first optical energy emitted by the LED 20, and to be transparent to the second optical energy that is converted and emitted by the luminescence conversion material layer 60. In a case where the LED generates first optical energy at ultraviolet wavelengths, the filter 80 can be configured to absorb energy at ultraviolet wavelengths, preventing human exposure to harmful ultraviolet energy. In certain applications, the filter can be configured to dissipate heat. In alternative embodiments, an organic or inorganic dye can be applied to the filter to intercept or pass a specific wavelength or color, for example for use in stage or theater illumination or in traffic light applications.

Figure 5A:
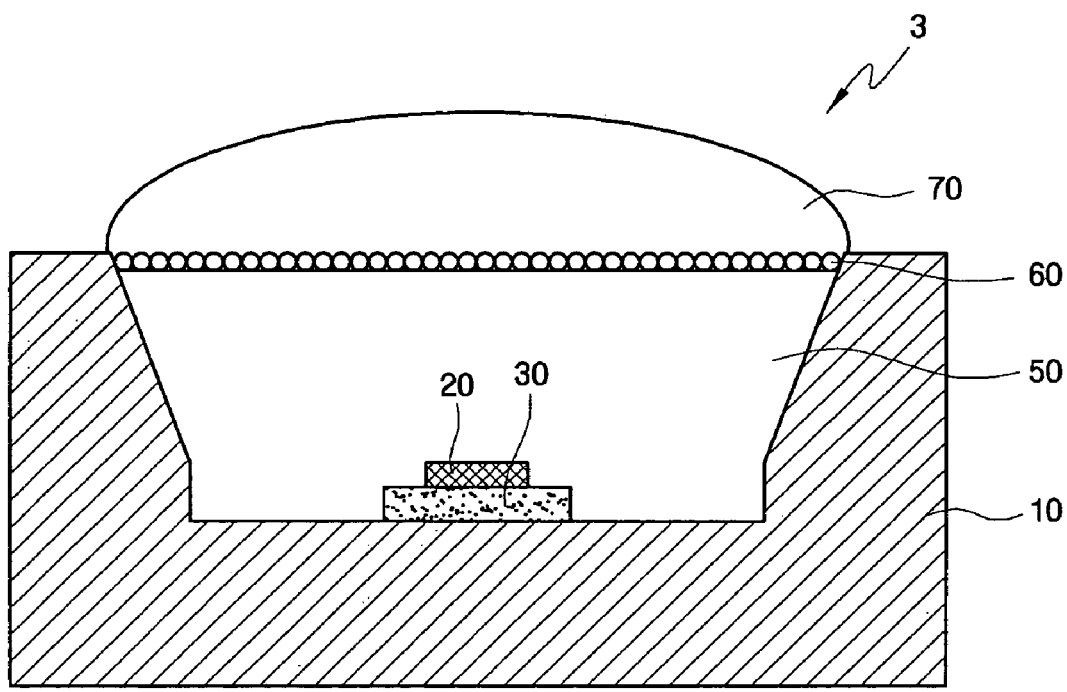
FIGS. 5A and 5B are cross-sectional diagrams of other embodiments of the present invention.
Figure 5B:
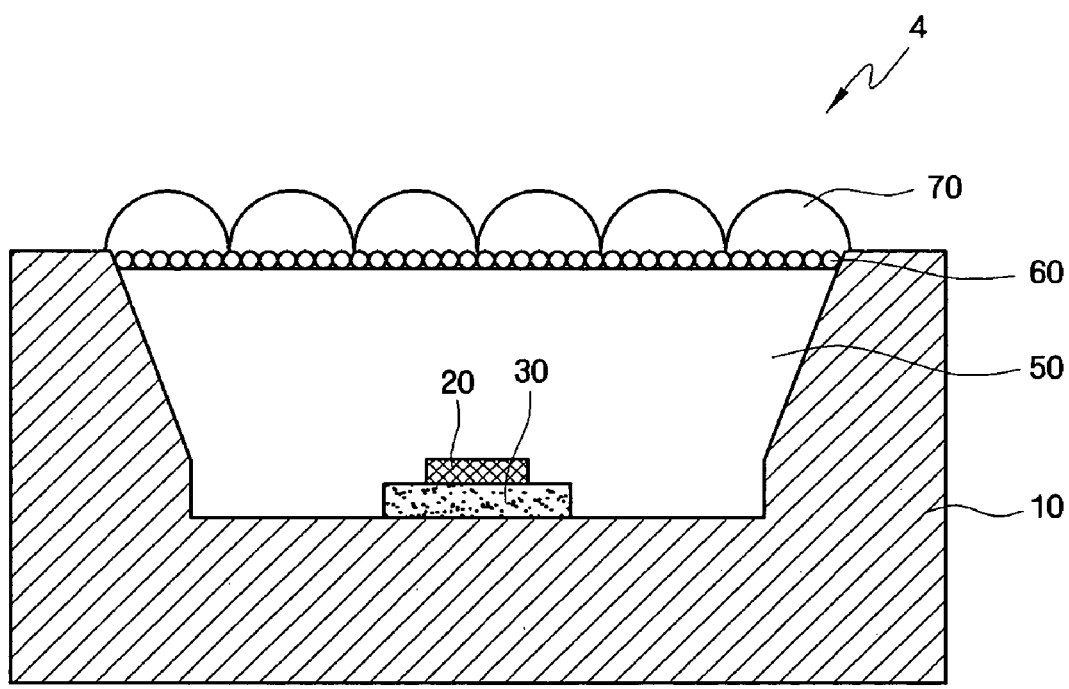

FIGS. 5A and 5B are cross-sectional diagrams of other embodiments of the present invention. In these embodiments, the second encapsulant layer 70 is formed in a lens shape to perform an optical function. In the embodiment of FIG. 5A, the second encapsulant layer 70 is formed in a single convex lens shape to provide for dispersion of optical energy emitted by the LED structure 3. In the embodiment of FIG. 5B, the second encapsulant layer 70 is formed as a multiple convex lens configuration to provide for greater dispersion of optical energy emitted by the LED structure 4. The second encapsulant layer 70 can also be formed in the shape of other suitable optical elements to perform a desired optical function for the device 3, 4.

FIGS. 6A-6E are cross-sectional diagrams illustrating the formation of an LED structure, in accordance with another embodiment of the present invention.

Figure 6A:
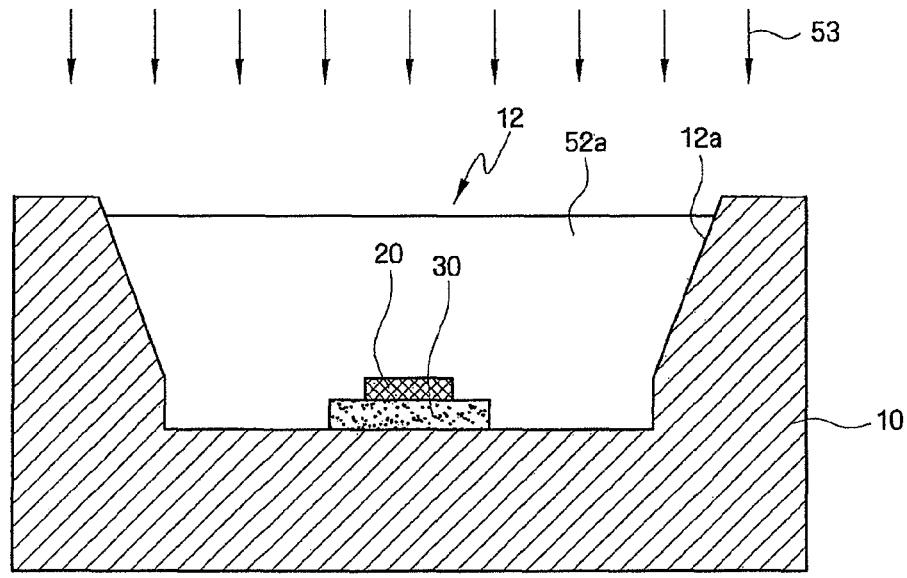
FIGS. 6A-6E are cross-sectional diagrams illustrating the formation of an LED structure, in accordance with another embodiment of the present invention.

Referring to FIG. 6A and step 502 of FIG. 2, a package substrate 10 is prepared to include a slot or opening 12, as described above. The package substrate 10 can include an optional sub-mount 30 in a central region of the package for locating an LED 20. The LED 20 can be mounted to the optional sub-mount 30, or, in other embodiments, mounted directly to the package substrate 10. In various embodiments, the LED can be configured to generate optical energy, for example optical energy at ultraviolet or blue wavelengths. The slot 12 can be configured with tapered sidewalls 12a as shown to increase the light emitting efficiency of the resulting package.

Figure 6B:
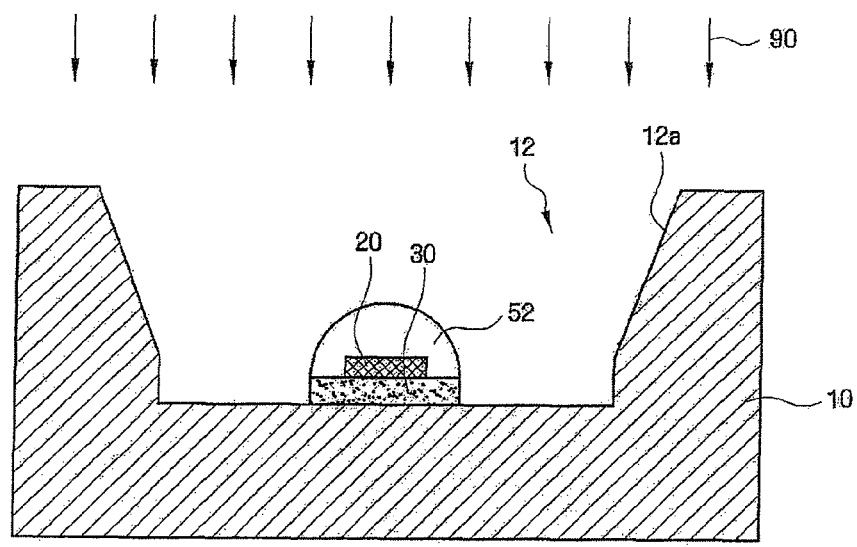

Continuing to refer to FIGS. 6A and 6B, and referring now to step 504 of FIG. 2, a first encapsulant 52, or resin layer, or encapsulant layer 52a, is provided in the opening 12 to cover the LED 20. Referring to FIG. 6B, in this embodiment, the first encapsulant 52 does not fill the opening to a level above an upper surface of the LED 20. Instead, the first encapsulant 52 of the present embodiment is provided to exclusively cover the LED 20 and a region immediately surrounding the LED 20, for example, covering the region of the device that lies above the submount or substrate 30, as shown. In one embodiment, the first encapsulant 52 is selectively applied to the LED 20 and submount 30, and not to the package substrate 10. Referring to FIG. 6A, in another embodiment, the encapsulant layer 52a is applied to the entire opening 12, including the package substrate 10, the LED 20 and the submount 30, and is then selectively patterned 53 so that the first encapsulant 52 remains exclusively on the LED 20 and optionally at regions immediately surrounding the LED 20. As in the above-described embodiment of FIGS. 1A-1E, the first encapsulant 52 can comprise a material that is transparent to the optical energy at the wavelengths emitted by the LED 20. In various embodiments, the first encapsulant 52 can comprise at least one of epoxy, silicone, rigid silicone, urethane, oxethane, acryl, polycarbonate, polyimide, a mixture of at least two of these, suitable for protecting the underlying LED 20.

Continuing to refer to FIG. 6B and referring now to step 506 of FIG. 2, as in the above-described embodiment, a first annealing 90 is performed on the resulting structure, including the first encapsulant 52. The process conditions of the first annealing 90, including temperature, pressure, and duration, are selected so that a soft-curing of the first encapsulant 52 is achieved. In a soft-cured state, the first encapsulant 52 is no longer in a fluid state and is not fully hardened. Instead, the first encapsulant 52 is made to be sufficiently hard by the first annealing 90 so that when a luminescence conversion material, such as a phosphor material, is later applied to a top surface of the first encapsulant 52, the luminescence conversion material does not penetrate substantially into the first encapsulant 52, but rather, the luminescence conversion material bonds to a top surface or top region of the first encapsulant 52. Process conditions of the first annealing 90 can be determined as described above in connection with the embodiment of FIGS. 1A-1E.

Figure 6C:
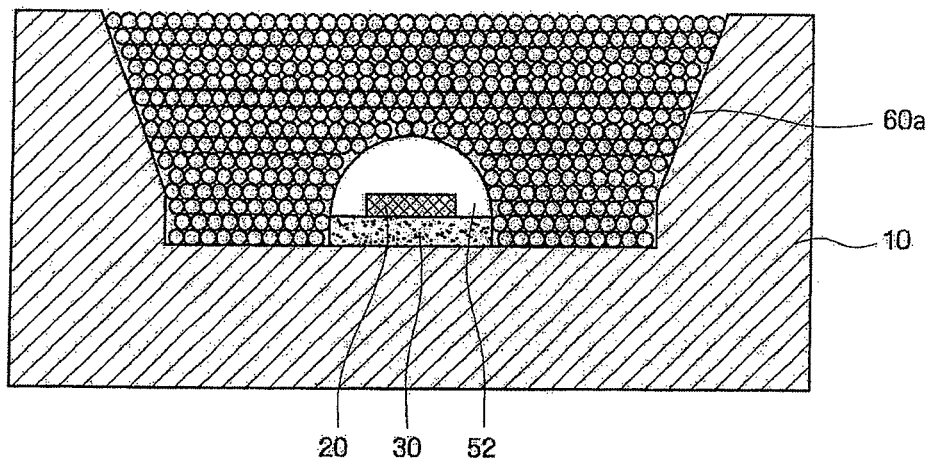

Referring to FIG. 6C and step 508 of FIG. 2, a luminescence conversion material 60a is applied to the resulting soft-cured first encapsulant 52. In one embodiment, the luminescence conversion material 60a comprises a powder-type substance that is applied using a deposition process. The luminescence conversion material 60a can be applied to the soft-cured first encapsulant 52 under a physical force, for example in the manner shown above in connection with FIG. 3, such as a thermal stress or mechanical pressure so that a lower portion of the luminescence conversion material 60a is physically pushed into, or bonded to, the upper surface of the soft-cured first encapsulant 52. Since the first encapsulant 52 is in a soft-cured state, and is not hardened, the upper surface thereof is receptive of the luminescence conversion material 60a, and particles of the luminescence conversion material 60a bond thereto.

Figure 6D:
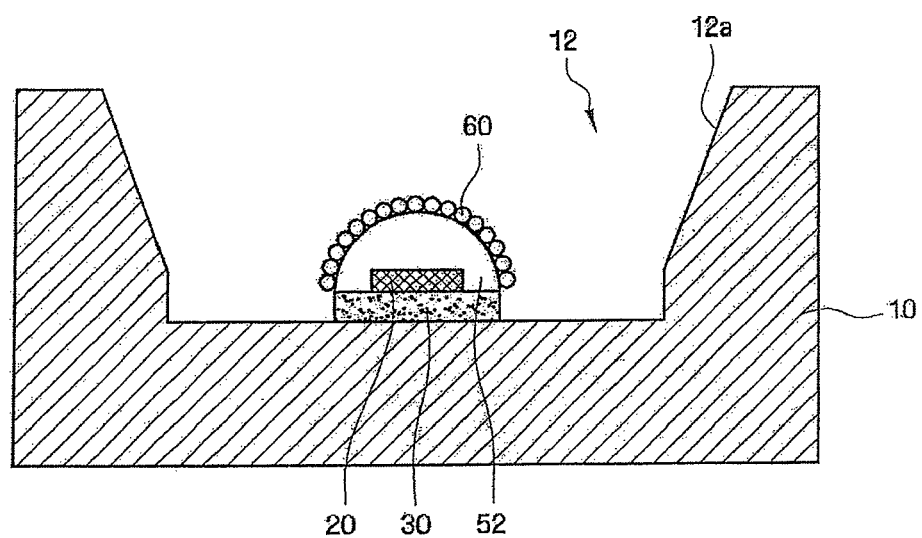
Figure 6:
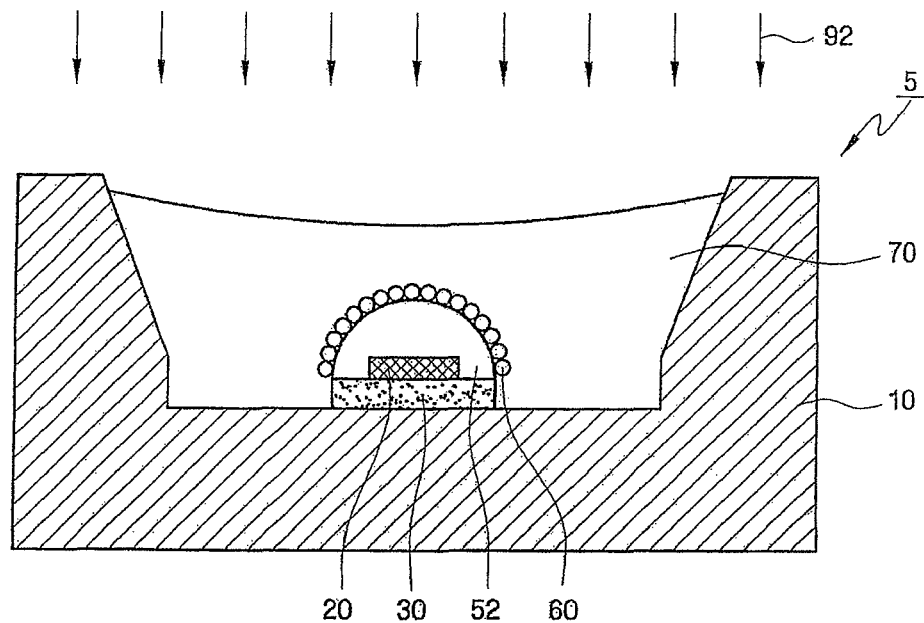

Referring to FIG. 6D and step 510 of FIG. 2, excess luminescence conversion material 60a is removed from the upper surface of the first encapsulant 52, for example, in the manner described above in connection with FIG. 1D. As a result, a luminescence conversion material layer 60 remains on an upper surface of the first encapsulant 52. Also, the luminescence conversion material layer 60 consists essentially of luminescence conversion material 60a, as described above in connection with the embodiment of FIG. 1D. The thickness of the resulting luminescence conversion material layer 60 determines the conversion efficiency of the resulting device, as described above in connection with the embodiment of FIGS. 1A-1E.

Referring to FIG. 6E and step 512 of FIG. 2, an optional second encapsulant layer 70, for example, a passivation layer, is formed on the resulting luminescence conversion material layer 60. The second encapsulant layer 70 operates to protect the underlying luminescence conversion material layer 60 from external environmental conditions, for example, protection from exposure to moisture. In various embodiments, the second encapsulant layer 70 can be formed to be substantially flat, or can be formed to include various optical features, as will be described below in connection further embodiments. The second encapsulant layer 70 can comprise, for example, materials described above in connection with the description of the embodiment of FIGS. 1A-1E.

Continuing to refer to FIG. 6E and referring now to step 514 of FIG. 2, a second annealing process 92 is performed on the resulting structure, including the soft-cured first encapsulant 52, the luminescence conversion material layer 60, and the second encapsulant layer 70. The process conditions of the second annealing 92, including temperature, pressure, and duration, are selected so that a hard-curing of the first encapsulant 50 is achieved. In a hard-cured state, the first encapsulant 52 is substantially fully hardened for the resulting LED device 5. As in the above described embodiment of FIGS. 1A-1E, the process conditions of the second annealing 92 vary with the type of first encapsulant and the volume of first encapsulant 52 present; in general, a larger volume of first encapsulant 52 requires a longer annealing time for the second annealing step.

Continuing to refer to FIG. 6E and referring now to steps 516 and 518 of FIG. 2, in another embodiment, the second annealing 92 can be optionally performed prior to formation of the second encapsulant layer 70.

Figure 7A:
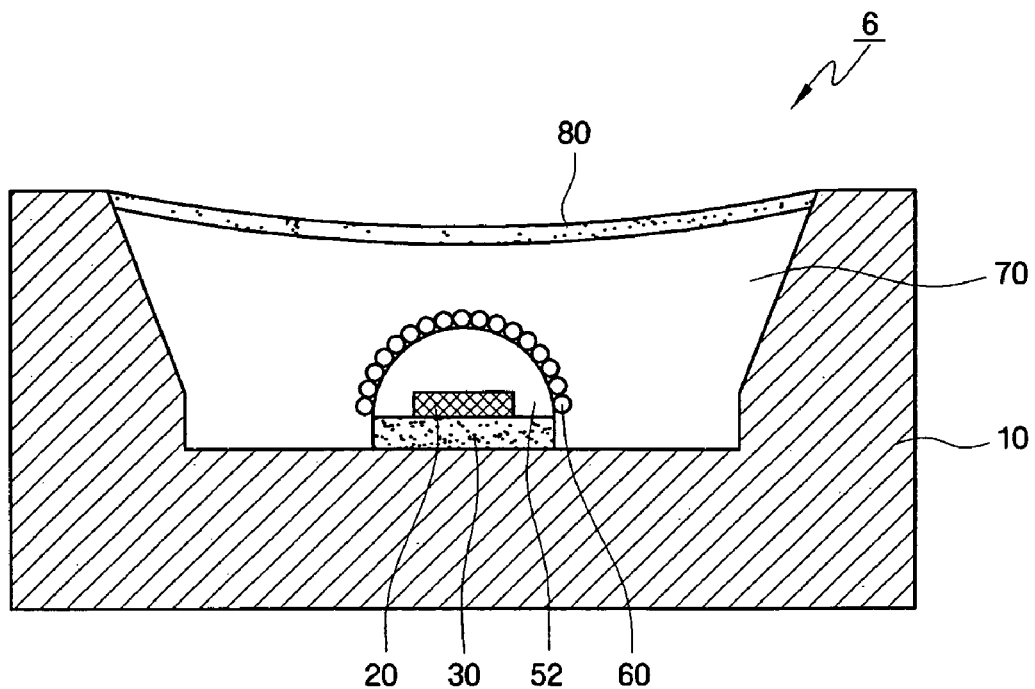
FIGS. 7A-7C are cross-sectional diagrams of other embodiments of the present invention.
Figure 7B:
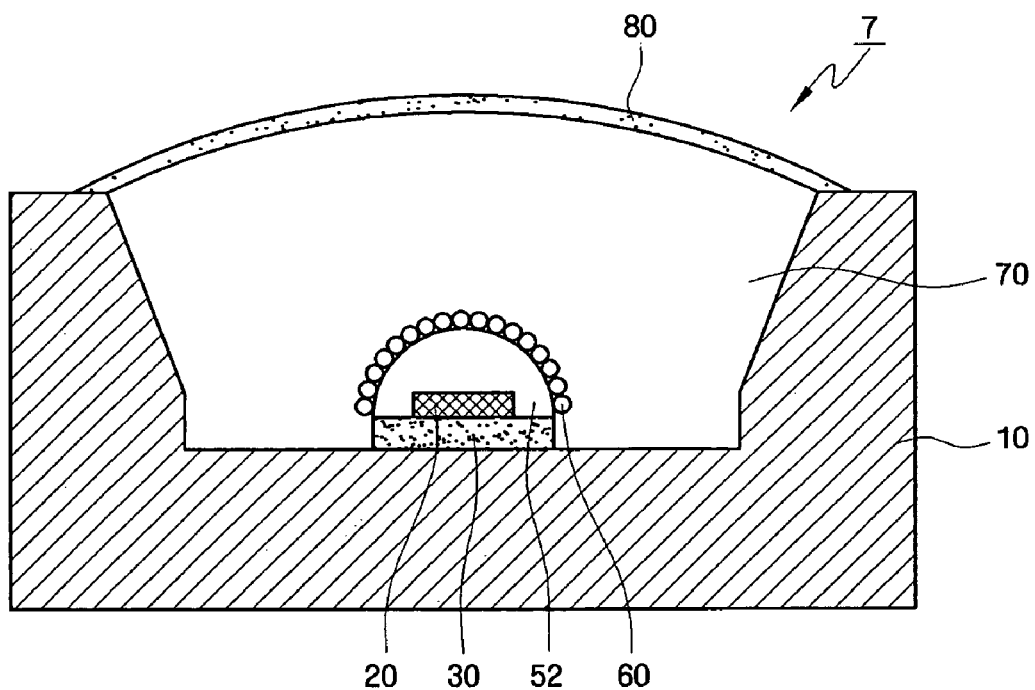
Figure 7C:
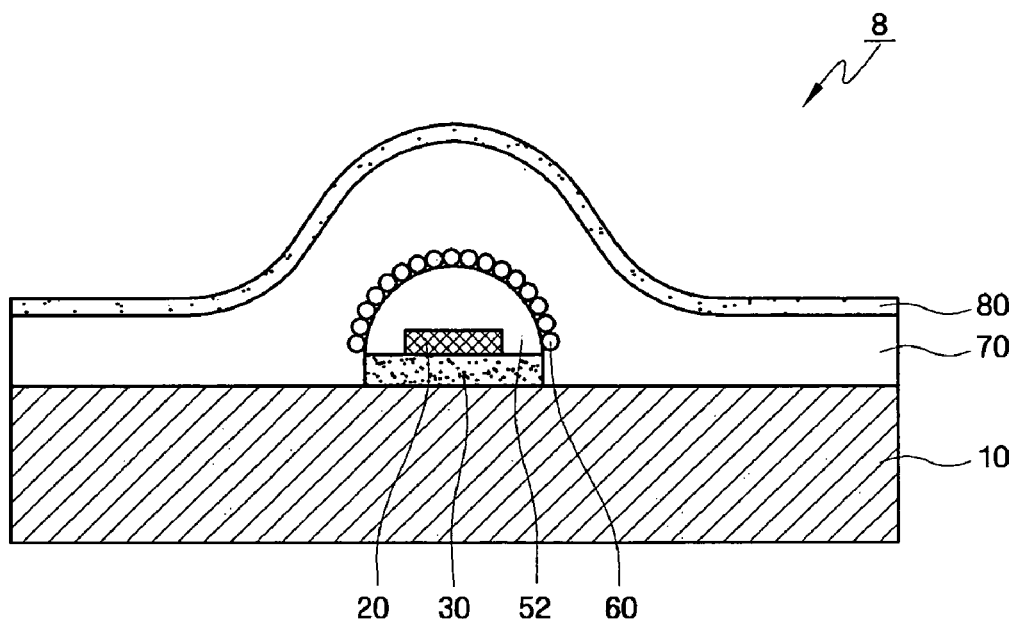

FIGS. 7A-7C are cross-sectional diagrams of other embodiments of the present invention. In these embodiments, the second encapsulant layer 70 is formed in a lens shape to perform an optical function. In the embodiments shown, an optional wavelength filter 80 is applied in the optical path of the emitted optical energy, for example, on the passivation layer 70 in order to filter the optical energy emitted by the device 6, 7, 8. In the embodiment of FIG. 7A, the second encapsulant layer 70 is formed in a concave single lens shape to provide for focusing of optical energy emitted by the LED structure 6. In the embodiment of FIG. 7B, the second encapsulant layer 70 is formed in a convex single lens shape to provide for dispersion of optical energy emitted by the LED structure 7. In the embodiment of FIG. 7C, the second encapsulant layer 70 is formed as a highly convex single lens configuration to provide for greater dispersion of optical energy emitted by the LED structure 8. Also, in the FIG. 7C embodiment, the LED 20 and submount 30 are mounted to a flat package substrate 10, rather than in a slotted package substrate, which can be desirable for certain applications.

Figure 8A:
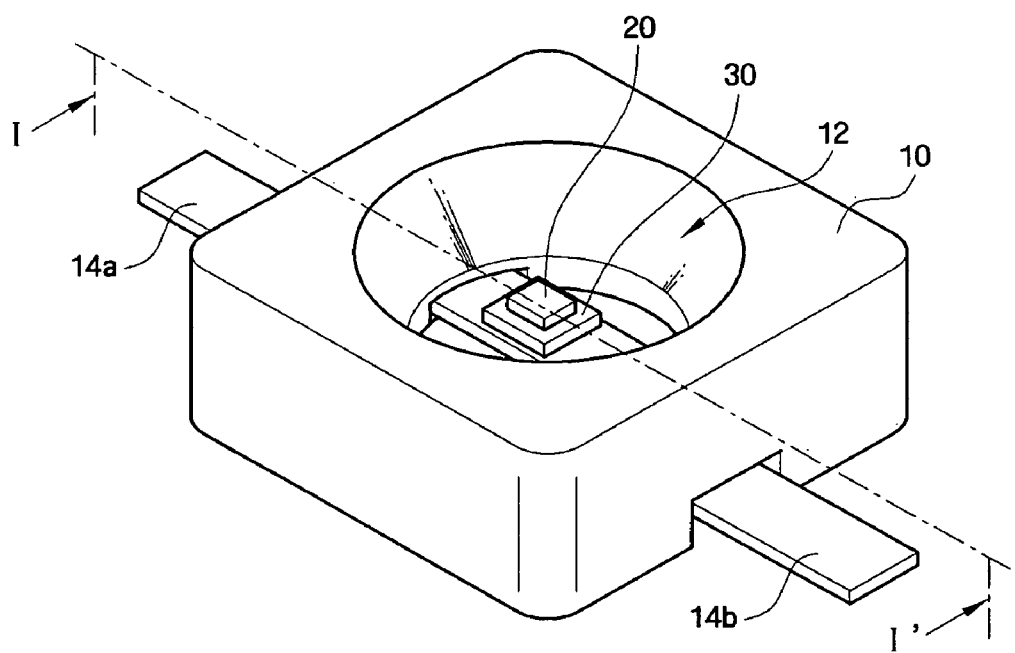
FIG. 8A is a perspective view of a LED structure package in accordance with an embodiment of the present invention.
Figure 8B:
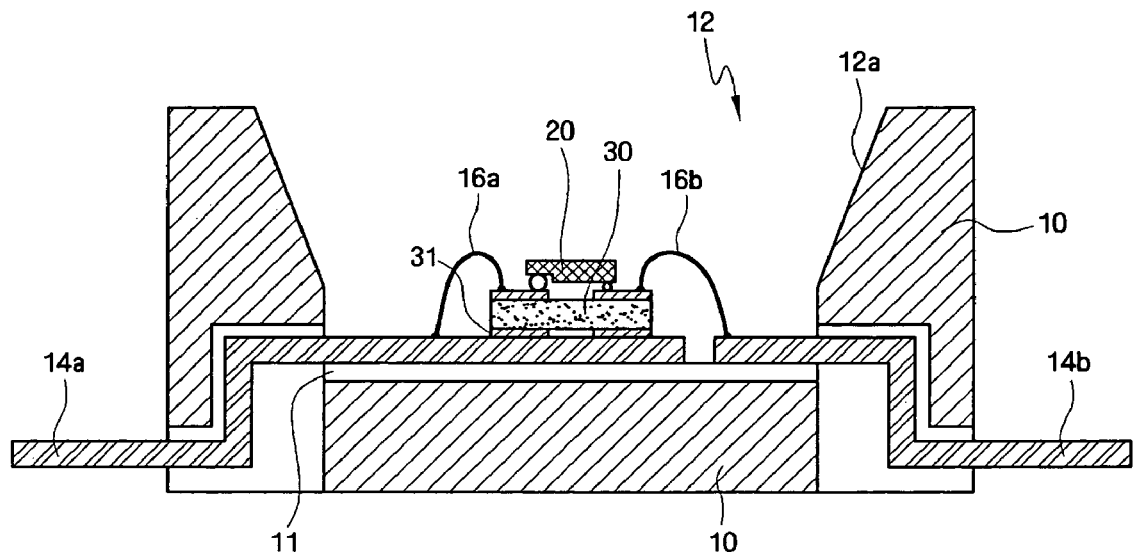
FIGS. 8B-8D are cross-sectional views of the LED structure package of FIG. 8A, taken along section line I-I' of FIG. 8A, in accordance with various embodiments of the present invention.
Figure 8C:
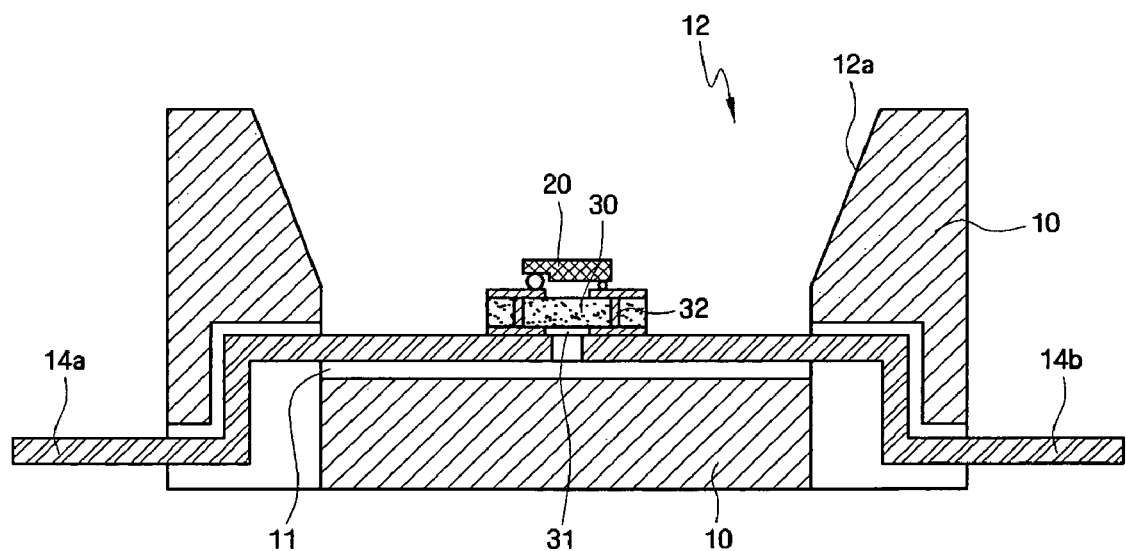
Figure 8D:
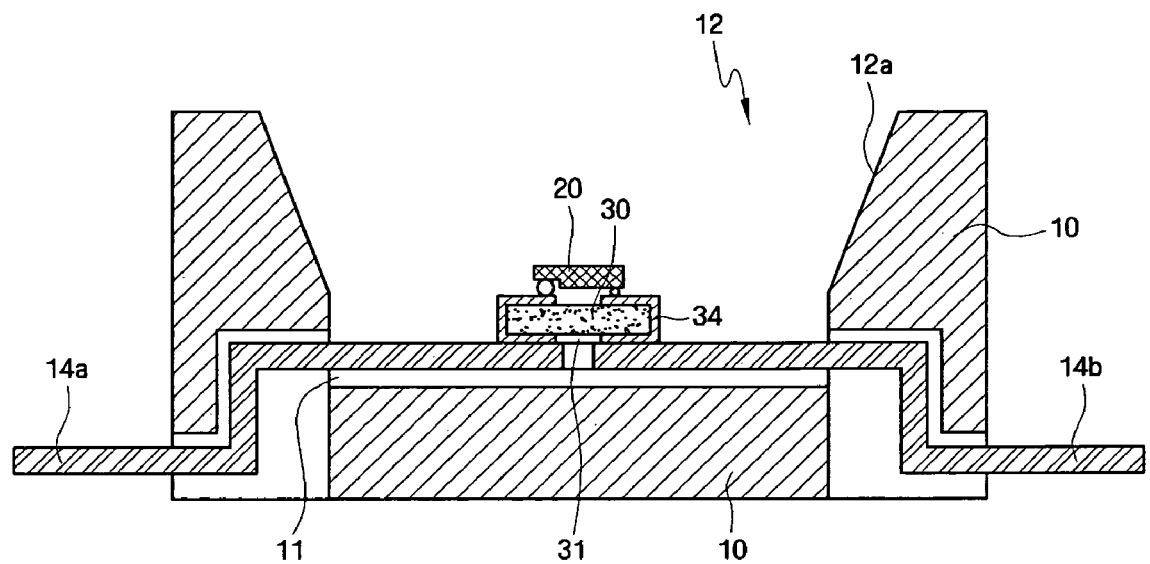

FIG. 8A is a perspective view of a LED structure package in accordance with an embodiment of the present invention. FIGS. 8B-8D are cross-sectional views of the LED structure package of FIG. 8A, taken along section line I-I' of FIG. 8A, in accordance with various embodiments of the present invention. The various embodiments are shown for illustrative purposes, and the embodiments of the present invention are not limited thereto.

Referring to FIG. 8A, a first lead 14a and a second lead 14b of the LED package are coupled to the LED 20 to apply a bias voltage or current thereto to cause the generation of optical energy by the LED 20. The first and second leads 14a, 14b can be formed, for example, of a thermally conductive material so that they operate to remove heat from the LED package.

Referring to FIG. 8B, in one embodiment, the first lead 14a and second lead 14b are isolated from the package substrate 10 by insulation layer 11. In this example, the submount 30 lies on the first lead 14a, isolated therefrom by insulation layer 31. Bonding wire 16a couples the first lead 14a to the first junction of the LED 20, and bonding wire 16b couples the second lead 14b to the second junction of the LED 20.

Referring to FIG. 8C, in another embodiment, the submount 30 is mounted on both the first lead 14a and the second lead 14b, isolated therefrom by insulation layer 31. Interlayer vias 32 extending through the submount 30 respectively couple the first lead 14a to the first junction of the LED 20 and the second lead 14b to the second junction of the LED 20.

Referring to FIG. 8D, in another embodiment, the submount 30 is mounted on both the first lead 14a and the second lead 14b, isolated therefrom by insulation layer 31. Interlayer surface interconnects 34 respectively couple the first lead 14a to the first junction of the LED 20 and the second lead 14b to the second junction of the LED 20. The embodiments of FIGS. 8C and 8D are conducive to smaller package geometries.

Figure 9A:
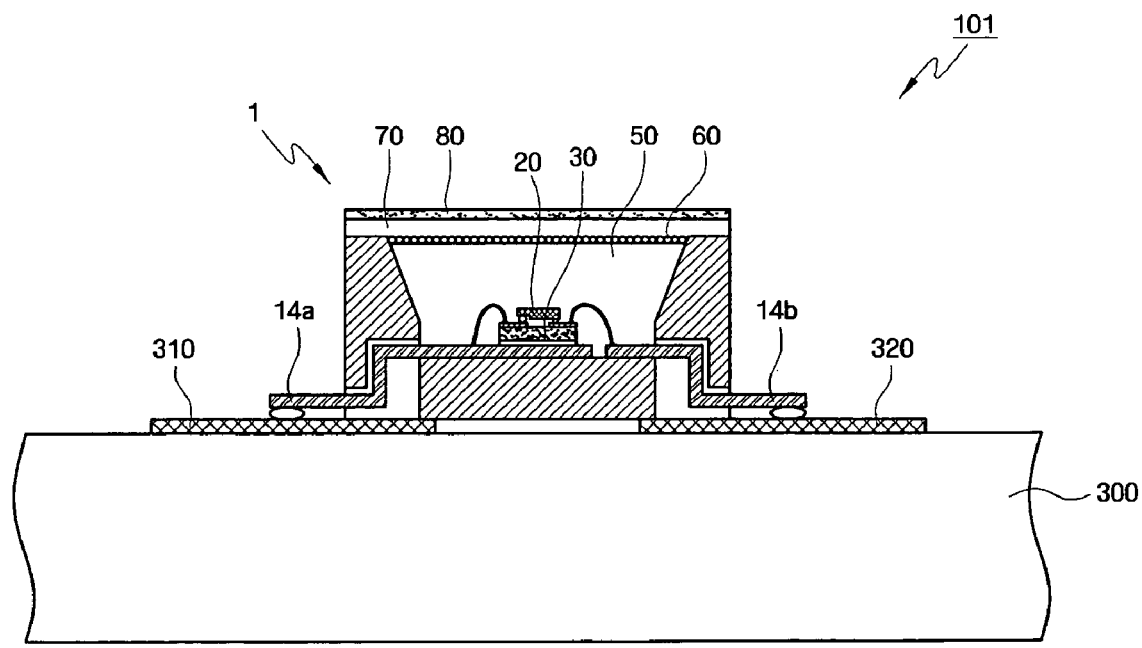
FIGS. 9A and 9B are cross-sectional views of an LED package module, in accordance with various embodiments of the present invention.
Figure 9B:
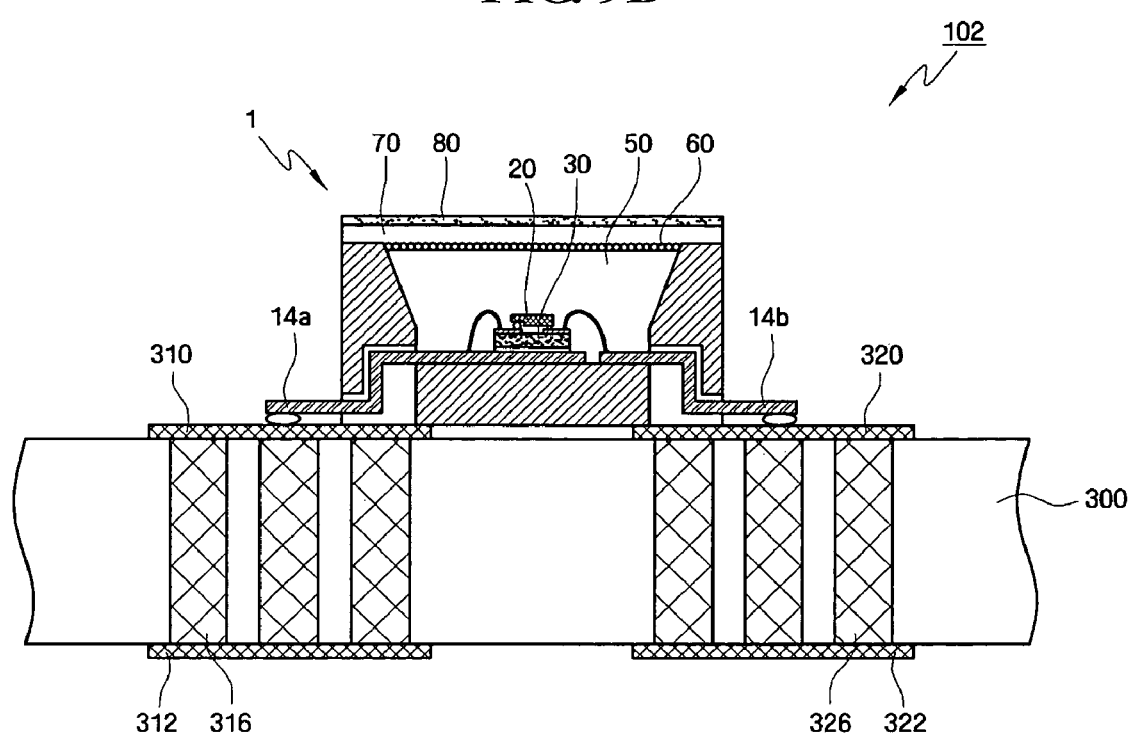

FIGS. 9A and 9B are cross-sectional views of an LED package module, in accordance with various embodiments of the present invention. The various embodiments are shown for illustrative purposes, and the embodiments of the present invention are not limited thereto.

Referring to FIG. 9A, an LED package 1, for example, an LED package configured as described above in connection with FIG. 4 and FIG. 8B, is mounted to a circuit board 300 to provide an LED package module 101. The first lead 14a of the LED package 1 is electrically coupled to a first conductor 310 of the circuit board 300 and the second lead 14b of the LED package 1 is electrically coupled to a second conductor 320 of the circuit board 300. The first and second conductors 310, 320 are in turn coupled to a main driving system on the circuit board, or in communication with the circuit board 300.

Referring to FIG. 9B, another embodiment of the LED package module 102 is similar to the LED package module described above in connection with FIG. 9A, the exception being that the circuit board 300 in the present example includes first and second interlayer vias 316, 326 respectively connecting the first and second first and second conductors 310, 320 on a first side of the circuit board 300 to third and fourth conductors 312, 322 on a second side of the circuit board 300.

Figure 10A:
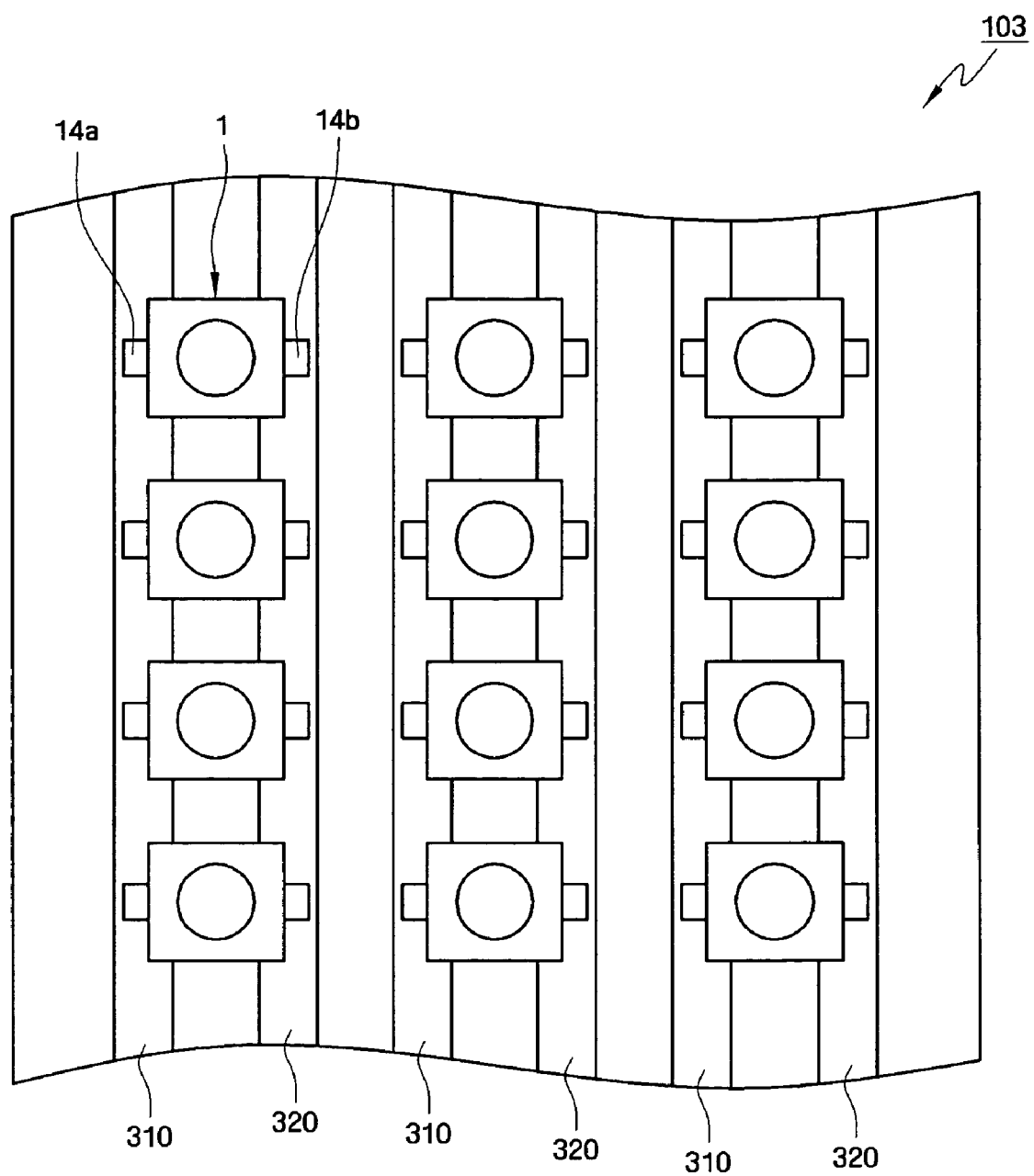
FIG. 10A is a top view and FIGS. 10B and 10C are perspective views, respectively, of LED array package modules, in accordance with various embodiments of the present invention.
Figure 10B:
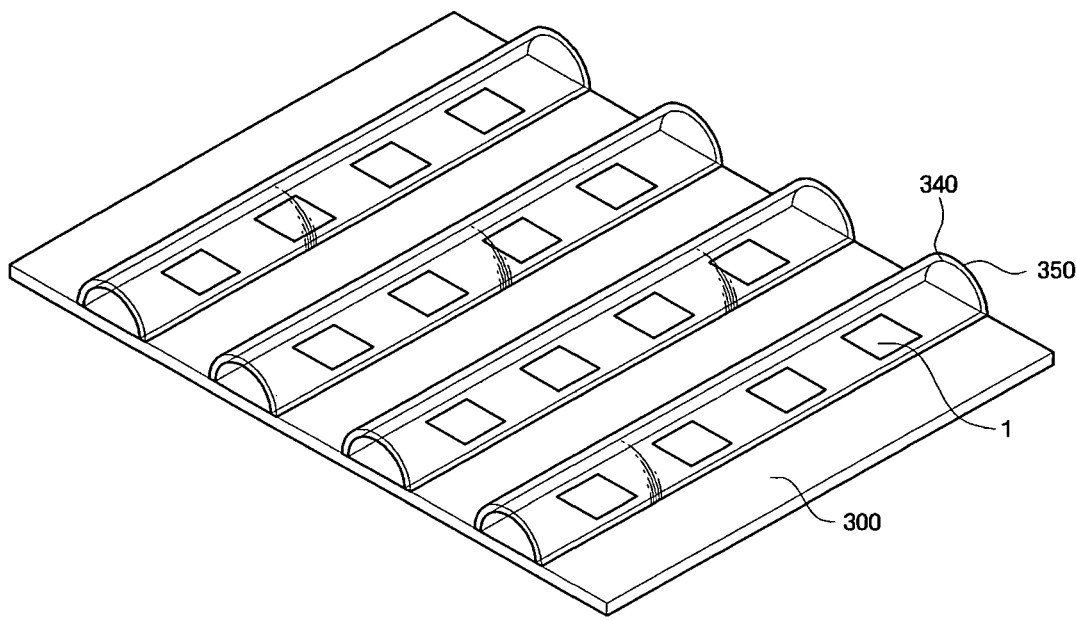
Figure 10C:
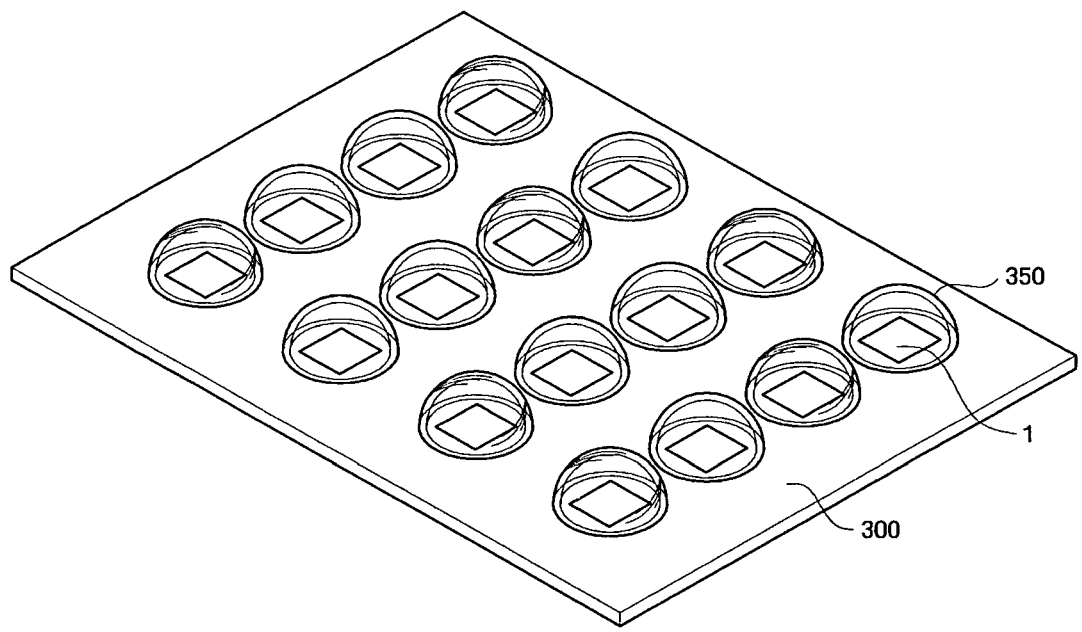

FIG. 10A is a top view and FIGS. 10B and 10C are perspective views, respectively, of LED array package modules, in accordance with various embodiments of the present invention. The various embodiments are shown for illustrative purposes, and the embodiments of the present invention are not limited thereto.

Referring to FIG. 10A, an LED package array 103 includes columns of LED packages 1 having first and second leads 14a, 14b respectively coupled to each other by first and second conductive interconnects 310, 320. In this manner, LED packages 1 sharing a column are activated to emit optical energy at the same time. The first and second conductive interconnects 310, 320 of respective columns can likewise be coupled together so that the LED packages of all columns can be activated to emit at the same time.

Referring to FIG. 10B, cylindrical lenses 340 formed of encapsulation material can be formed along the columns, or alternatively, across the columns, of LED packages formed on a common substrate 300, to perform optical functions as desired. Referring to FIG. 10B, in this embodiment, the LED packages along columns or rows of the array are configured with individual convex lenses 350 formed of encapsulation material to provide another optical function for the array.

Figure 11:
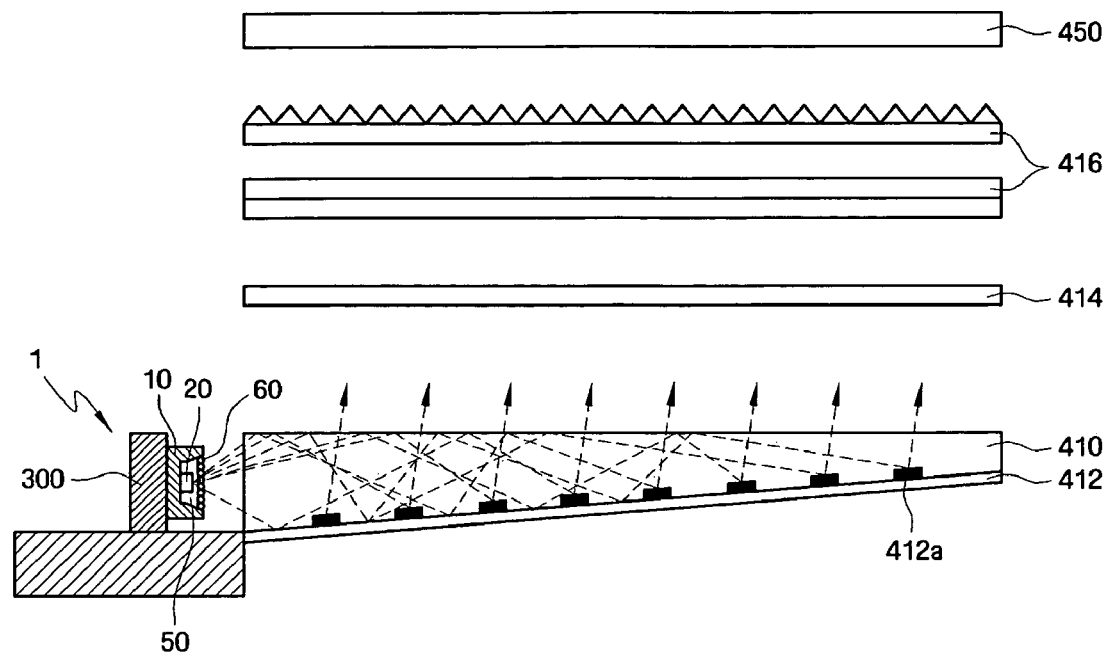
FIG. 11 is an exploded cross-sectional view of an LED system, in a display panel application, accordance with an embodiment of the present invention.

FIG. 11 is an exploded cross-sectional view of an LED system in a display panel application, in accordance with an embodiment of the present invention. Conventionally, this type of system is an edge type back light unit (BLU) in a liquid crystal display (LCD) device. In this embodiment, an LED package 1 or LED package array is mounted to a circuit board 300. The LED package 1 can be a side-view type. A transfer sheet 410 can be made of a transparent plastic resin, such as acrylic and receives the emitted optical energy and operates as a waveguide to present the optical energy to a reflective sheet 412 having a pattern 412a thereon. The reflected optical energy is emitted from a side region of the transfer sheet and is incident on a spreading sheet 414, which operates to disperse the optical energy. A plurality of prism sheets 416 operate to further guide the emitted optical energy toward a display panel 450 so that the energy is primarily orthogonal to a direction of extension of the panel 450.

FIGS. 12A-12D are views of LED systems, in accordance with other embodiments of the present invention.

Figure 12A:
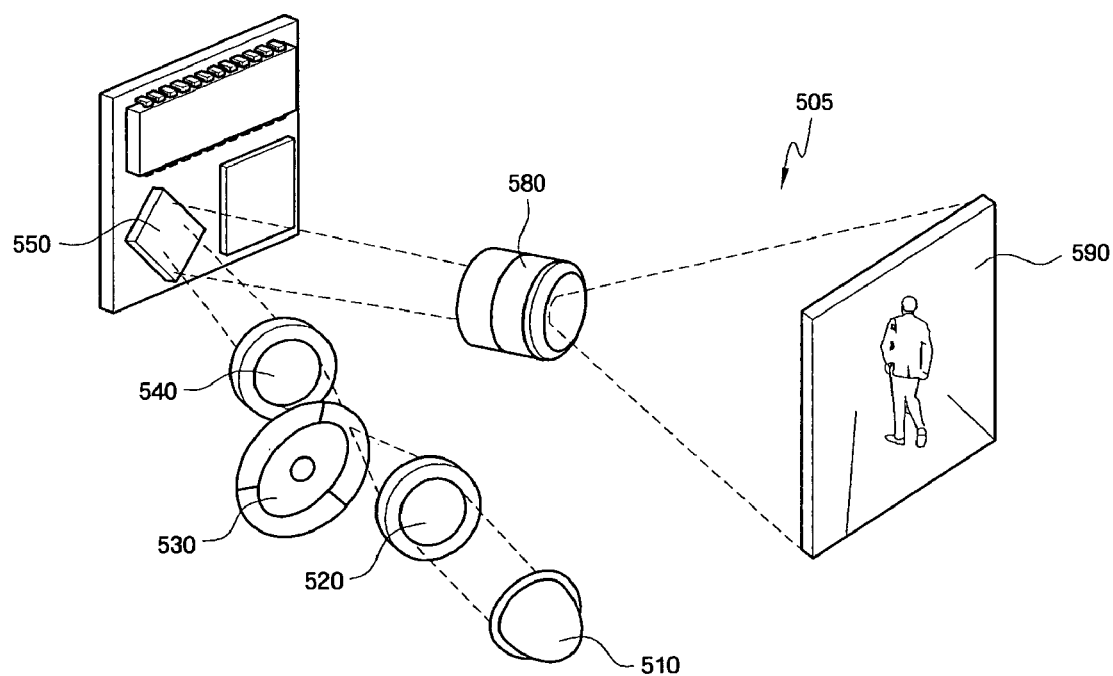
FIGS. 12A-12D are views of LED systems, in accordance with other embodiments of the present invention.

Referring to FIG. 12A, another example application of an LED system in accordance with an embodiment of the present invention is illustrated. In this example, a projector system 505 includes a light source 510 in turn including an LED package 1 of the type described herein. The emitted light is incident on a condensing lens 520 and is applied to a color filter 530. A sharping lens 540 directs the light to an image modulating device, for example, a digital micromirror device (DMD) which modulates the applied light by the desired image and presents reflected light to a projection lens 580. The projection lens 580 in turn directs the image-modulated light to a projection screen 590.

Figure 12B:
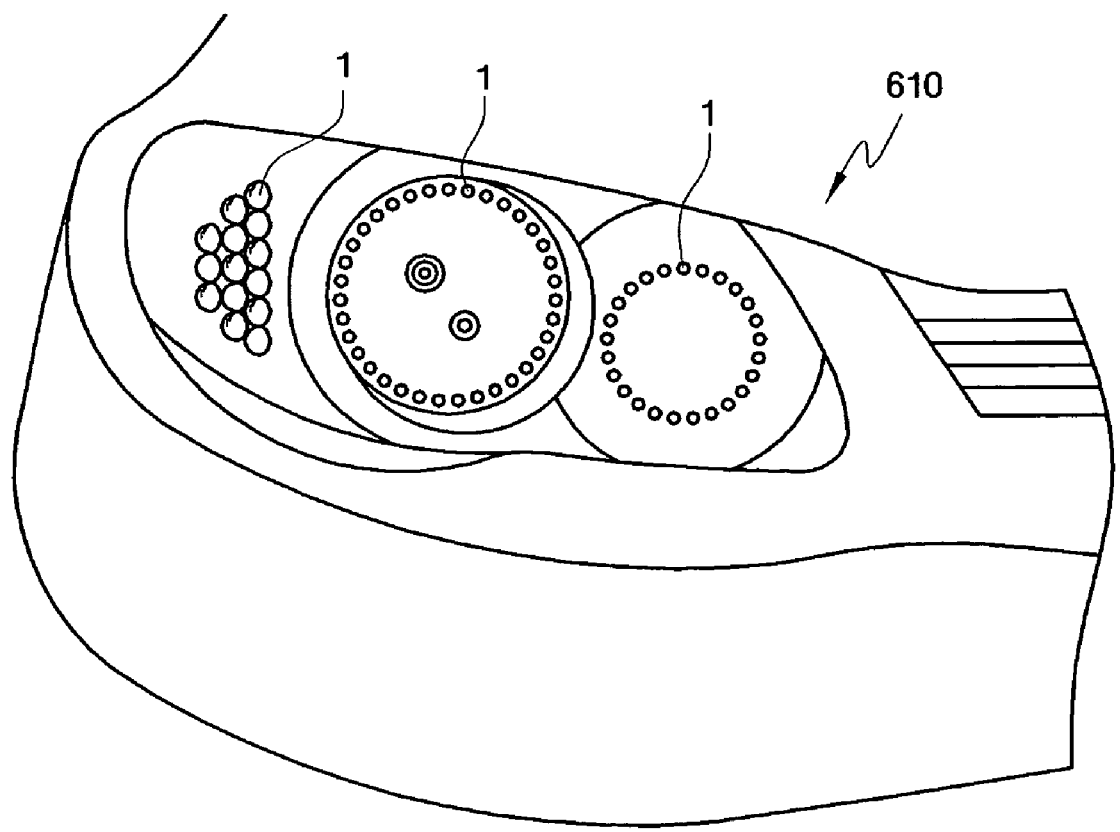

Referring to FIG. 12B, another example application of an LED system in accordance with an embodiment of the present invention is illustrated. In this example, the LED system of the present invention including LED packages 1 of the type described above is applied to an automobile headlight, auxiliary light or tail-light system 610.

Figure 12C:
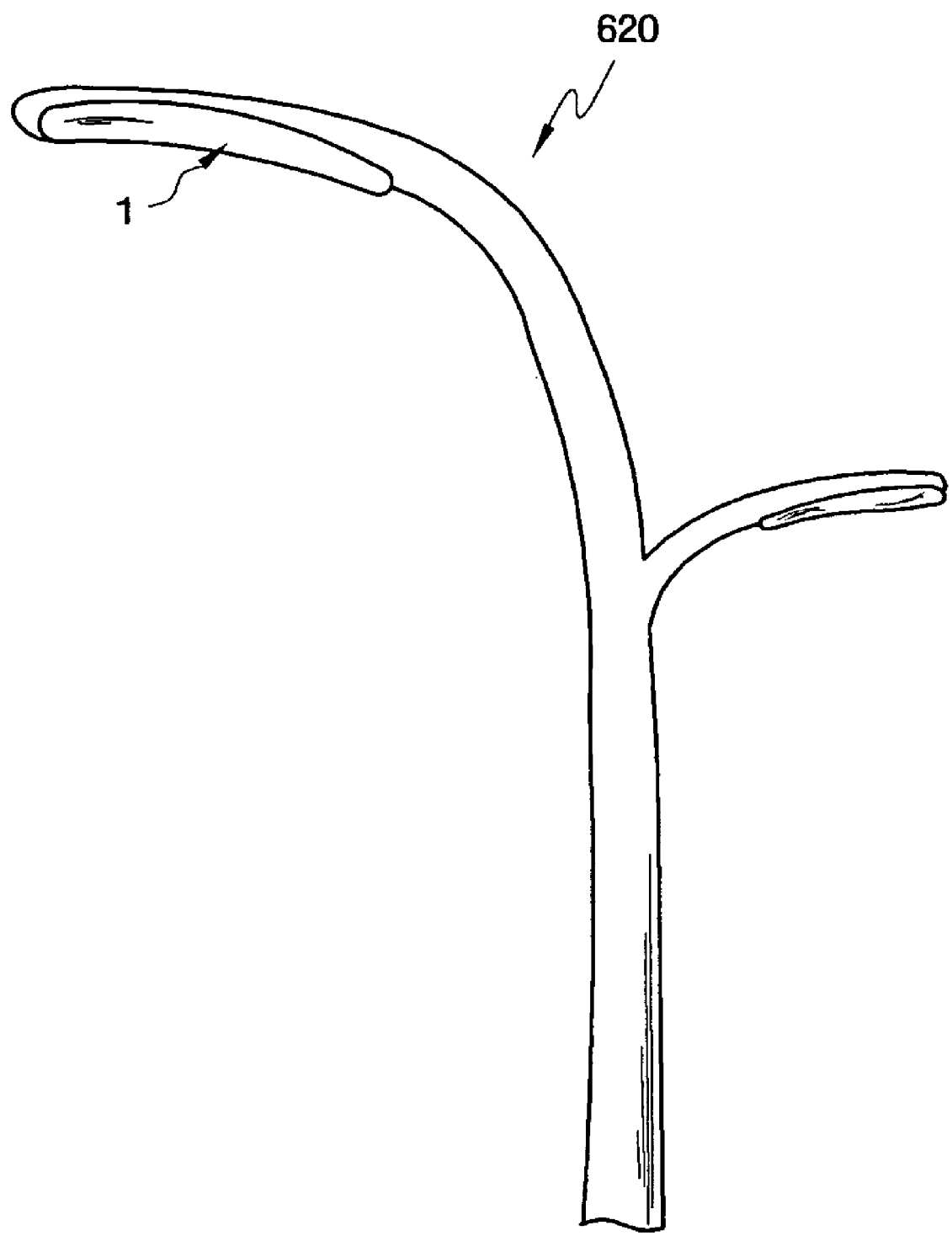

Referring to FIG. 12C, another example application of an LED system in accordance with an embodiment of the present invention is illustrated. In this example, the LED system of the present invention including LED packages 1 of the type described above is applied to a street lamp, or traffic lamp, system 620.

Figure 12D:
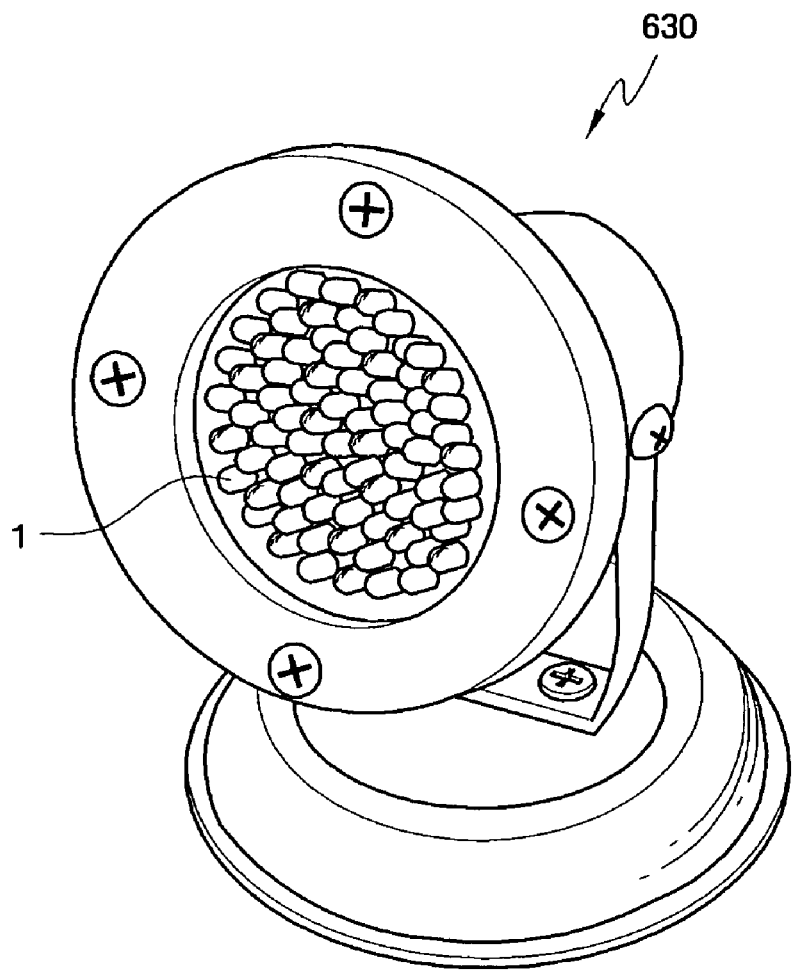

Referring to FIG. 12D, another example application of an LED system in accordance with an embodiment of the present invention is illustrated. In this example, the LED system of the present invention including LED packages 1 of the type described above is applied to an illumination lighting system 630, such as a spot light or flood light.

Figure 13:
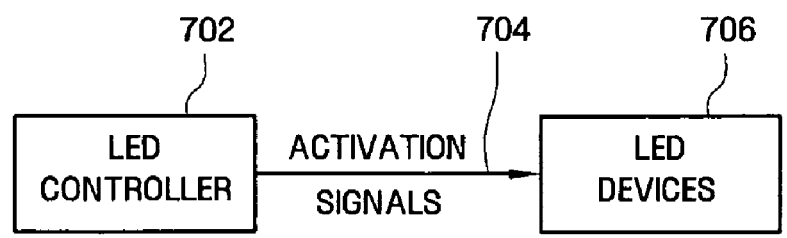
FIG. 13 is a block diagram of an LED system, in accordance with embodiments of the present invention.

FIG. 13 is a block diagram of an LED system, in accordance with embodiments of the present invention. Referring to FIG. 13, an LED system includes an LED controller 702, for example, an LED controller that generates LED activation signals that activate and deactivate one or more LED devices 706. The activation signals 704 comprise, for example, the driving signals that forward bias the LED devices 706 so that they emit optical energy. The LED devices 706, of the type described herein, can be activated individually, for example in display applications, or can be arranged in an array and activated collectively, for example in illumination applications. The LED controller 702 can be addressed and programmed by a processing system having memory, according to well-known data processing configurations.

In the various embodiments described herein, the LED can comprise any of a number of suitable types of LEDs, including, for example, $In_xAl_yGa_{(1-x-y)}$ ($0 \leq x \leq 1$, $0 \leq y \leq 1$) LEDs. In various embodiments, the LED can be configured, for example, as a flip-chip type LED, a vertical type LED or a lateral type LED, and the LED package can be configured as a top-view type package or a side-view type package, for example. Contemporary LED chips for top-view type LED packages are commonly square-shaped, such as 1 mm×1 mm in size, and are particularly applicable to lighting systems, window illumination, and automobile head lamps. Contemporary LED chips for side-view type LED packages are usually rectangle-shaped such as 250 µm×600 µm in size, and find application in mobile display systems, such as mobile telephones, MP3 players and navigation systems.

The LED can be configured to generate any of a number of narrow-band or broad-band wavelengths of optical energy, including, for example, ultraviolet or blue wavelengths. Uniform chromaticity can be achieved, for example, by mounting the LED in a central region of the package substrate 10.

In the various embodiments described herein, the package substrate 10 can comprise any of a number of suitable materials, including, for example, an organic material having lightfast characteristics, for example, silicone resin, epoxy, acryl resin, urea-formaldehyde resin, imide resin, or fluororesin. Alternatively, the package substrate 10 can comprise an inorganic material having lightfast characteristics, for example, glass or silica gel. The package substrate 10 can be treated by a thermosetting process so that the resulting structure resists heat generated during device fabrication. Filler materials, such as AlN or AlO can be added to the material of the package substrate 10 to alleviate thermal stress that can be generated during later application and annealing of the first and second encapsulant layers. In other embodiments, metal or ceramic material can be applied to at least a portion of the package substrate 10 to increase heat dissipation properties of the resulting package.

In the various embodiments described herein, the luminescence conversion material 60a of the luminescence conversion material layer 60 can comprise any of the following or mixtures any of the following:

Nitride/oxide material activated by lanthanide, such as Eu, Ce etc.,
$M_2Si_5N_8$:Eu, $M_2Si_5N_8$:Eu, $MSi_7N_{10}$:Eu, $M_{1.8}Si_5O_{0.2}N_8$:Eu, $M_{0.9}Si_7O_{0.1}N_{10}$:Eu, $MSi_2O_2N_2$:Eu
(where M is selected from Sr, Ca, Ba, Mg, Zn)

Alkaline earth halogen apatite activated by lanthanide, transition metal (Mn etc.,).
$M_5(PO_4)_3X$:R
(where M is Sr, Ca, Ba, Mg, Zn; X is F, Cl, Br, I; R is Eu, Mn, Eu)

Alkaline earth metal-boride halogen phosphor.
$M_2B_5O_9X$:R
(where M is Sr, Ca, Ba, Mg, Zn; X is F, Cl, Br, I; R is Eu, Mn, Eu)

Alkaline earth metal-aluminate phosphor.
$SrAl_2O_4$:R, $Sr_4Al_{14}O_{25}$:R, $CaAl_2O_4$:R, $BaMg_2Al_{16}O_{27}$:R, $BaMg_2Al_{16}O_{12}$:R, $BaMgAl_{10}O_{17}$:R
(where R is Eu, Mn, Eu)

Alkaline earth silicate phosphor.
$(SrBa)_2SiO_4$:Eu

Alkaline earth emulsificate phosphor.
$La_2O_2S$:Eu, $Y_2O_2S$:Eu, $Gd_2O_2S$:Eu Alkaline earth thiogallate phosphor.
Alkaline earth nitrided silicon phosphor.
Germanate
Rare earth aluminate, rare earths silicate activated by lanthanide, such as Ce, Eu.
$Y_3Al_5O_{12}$:Ce, $(Y_{0.8}Gd_{0.2})_3Al_5O_{12}$:Ce, $Y_3(Al_{0.8}Ga_{0.2})_5O_{12}$:Ce, $(Y, Gd)_3(Al, Ga)_5O_{12}$[YAG]
$Tb_3Al_5O_{12}$:Ce, $Lu_3Al_5O_{12}$:Ce
ZnS:Eu, $Zn_2GeO_4$:Mn, $MGa_2S_4$:Eu
(where M is Sr, Ca, Ba, Mg, Zn; X is F, Cl)

Activating material can be changed or added:
Eu→Tb, Cu, Ag, Au, Cr, Nd, Dy, Co, Ni, Ti The luminescence conversion material 60a can also comprise another material well-suited for wavelength conversion of optical energy.

An experiment was conducted to determine whether the conversion efficiency value for an LED device can be optimized by controlling the thickness of the luminescence conversion material layer. The experiment included a 7 mm×7 mm top view LED package (1 mm×1 mm chip size), including a ultraviolet emitting LED and green phosphor material for the luminescence conversion material. The LED 20 was encased in a first encapsulant layer 50 comprising a transparent silicone resin, which filled the package opening 12 by about 90 percent. A first annealing operation 90 was performed to soft-cure the first encapsulant layer 50 at a temperature of 165 C for 100 seconds. A green phosphor material was provided as the luminescence conversion material 60a, excess luminescence conversion material 60a was removed to provide a luminescence conversion material layer 60, and the resultant was subjected to a second annealing operation 92 at a temperature of 165 C for 5 minutes in order to hard-cure the resulting device 1. Five such samples were prepared, each having resulting green phosphor thicknesses that were experimentally measured and different. The resulting green phosphor thickness was managed by applying a controlled mechanical pressure to the luminescence conversion material 60a, as described above. As a result, Samples 1 through 5 having green phosphor thicknesses of 226 μm, 224 μm, 190 μm, 153 μm and 108 μm respectively, as shown in Table 1 below, were provided.

Referring to the data of Table 1 below, a laboratory measurement of the output power of the optical energy of the LED at ultraviolet (UV) wavelengths was performed for each sample (Samples 1-5) before application of the green phosphor layer. In Table 1, it can be seen that the output energies at UV wavelengths of Samples 1-5 were 149 mW, 145 mW, 148 mW, 148 mW, and 147 mW, respectively, as shown in Table 1 below.

Next, a laboratory measurement of the output power of the optical energy at the ultraviolet (UV) wavelengths was performed for each sample (Samples 1-5) following application of the green phosphor layer. In Table 1, it can be seen that the output energy at UV wavelengths of the five samples were measured to be 4.3 mW, 4.6 mW, 7.5 mW, 11.1 mW, and 14.6 mW respectively, as shown in Table 1 below.

Also, a laboratory measurement of the output power of the optical energy at the converted green wavelengths was performed for each sample (Samples 1-5) following application of the green phosphor layer. In Table 1 it can be seen that the converted output energy at green wavelengths of the five samples were measured to be 67 mW, 74 mW, 91.3 mW, 106.8 mW, and 88 respectively, as shown in Table 1 below.

For each sample, the conversion efficiency of the resulting LED device, or, in this case, since phosphor was used as the luminescence conversion material layer, the phosphor conversion efficiency (PCE), can be calculated as:

PCE=output at green wavelengths/output at UV wavelengths(pre phosphor−post phosphor)

For example, for Sample 1:

PCE=67 mW/(149 mW−4.3 mW)=46.3%

PCE values for each sample (Samples 1-5) were calculated as 46.3%, 52.7%, 65%, 78%, and 66.5% respectively.

At the same time, the transmittance of each sample (Samples 1-5) was calculated as:

$$\text{Transmittance} = \frac{\text{output at } UV \text{ wavelengths (post phosphor)}}{\text{output at } UV \text{ wavelengths (pre phosphor)}}$$

For example, for Sample 1,

Transmittance=4.3 mW/149 mW=2.9%

Transmittance values for each sample (Samples 1-5) were calculated as 2.9%, 3.2%, 5%, 7.5%, and 10% respectively.

Figure 14A:
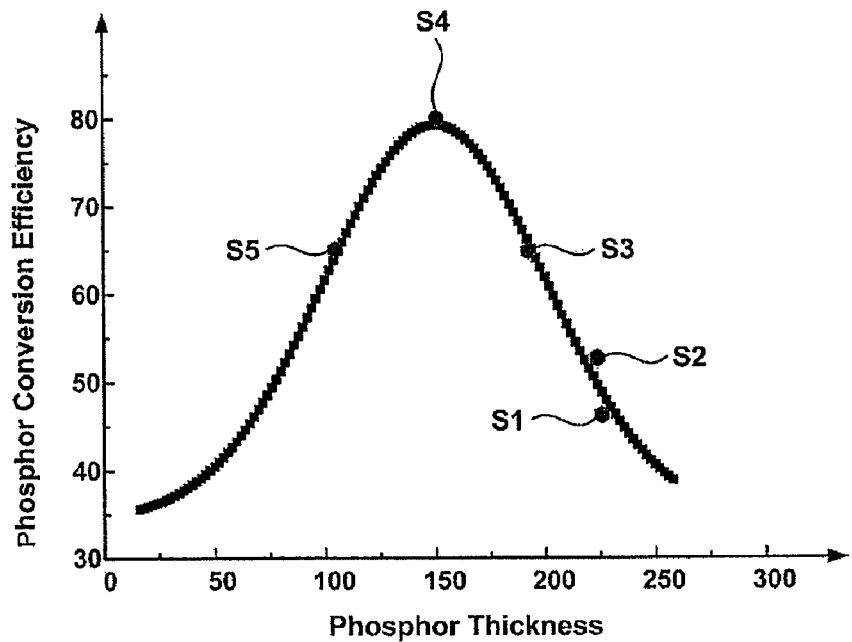
FIG. 14A is a plot of phosphor conversion efficiency as a function of phosphor thickness for experimental results obtained from sample embodiments prepared in accordance with the present invention.
Figure 14B:
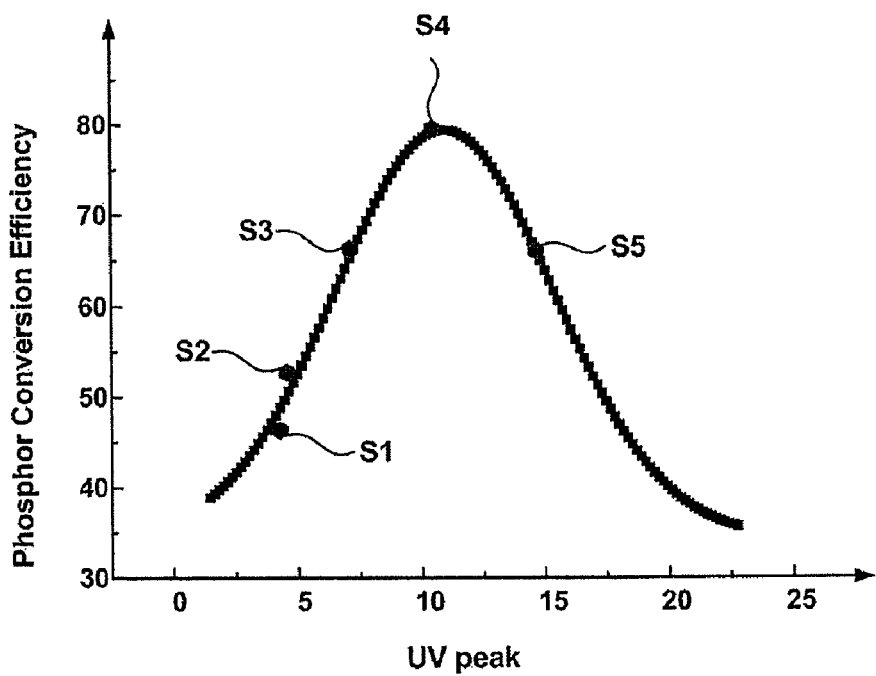
FIG. 14B is a plot of phosphor conversion efficiency as a function of output at UV wavelengths following application of the green phosphor conversion layer for experimental results obtained from sample embodiments prepared in accordance with the present invention.

FIG. 14A is a plot of phosphor conversion efficiency (PCE) as a function of phosphor thickness for experimental results obtained from sample embodiments prepared in accordance with the present invention; and FIG. 14B is a plot of phosphor conversion efficiency (PCE) as a function of output at UV wavelengths following application of the green phosphor conversion layer for experimental results obtained from sample embodiments prepared in accordance with the present invention.

Referring to FIGS. 14A and 14B, it can be seen that an optimum PCE for the experimental device occurs under the process conditions of Sample 4 S4. It can also be seen that when the PCE has a value ranging from 80% of the maximum value of about 78 to about 120% of the maximum value, the phosphor thickness of the sample (ranging from 200 μm to 100 μm for Samples 3-5, respectively) allows approximately 5% to 10% of the UV optical energy emitted by the LED to be transmitted; i.e., 5%-10% of the optical energy at UV wavelengths passes through the green phosphor layer unconverted. This demonstrates that the resulting conversion efficiency (in this experiment, PCE), of the device can be optimized by controlling the thickness of the luminescence conversion layer (in this experiment, green phosphor). The data plotted in FIG. 14B are extracted from Table 1 below to illustrate that PCE and UV power after phosphor conversion have a significant correlation. FIG. 14B demonstrates that, in this example, PCE has a maximum value when the UV power after phosphor is about 11 mW where the transmittance is 7.5%.

TABLE 1

| | Before | After phosphor | | | Trans- | Phosphor |
| | phosphor UV (mW) | UV (mW) | Green (mW) | PCE (%) | mittance (%) | thickness (μm) |
|---|---|---|---|---|---|---|
| Sample 1 | 149 | 4.3 | 67 | 46.3 | 2.9 | 226 |
| Sample 2 | 145 | 4.6 | 74 | 52.7 | 3.2 | 224 |
| Sample 3 | 148 | 7.5 | 91.3 | 65 | 5 | 190 |
| Sample 4 | 148 | 11.1 | 106.8 | 78 | 7.5 | 153 |
| Sample 5 | 147 | 14.6 | 88 | 66.5 | 10 | 108 |

In this manner, the devices, systems and methods in accordance with the present invention provide for high color repeatability in the resulting LED devices, while reducing the amount of luminescence conversion material needed, thereby reducing fabrication costs. In particular, the transmittance and conversion efficiency of the resulting LED device can be optimized by accurately controlling a thickness of a luminescence conversion material layer present in the device, where wavelength conversion of optical energy occurs. The thickness of the luminescence conversion material layer is accurately controlled by applying the luminescence conversion material to a top surface of a soft-cured first encapsulation layer that covers the underlying LED, and optionally, by applying a controlled pressure for pressing the applied luminescence conversion material into the top surface. Experimental results demonstrate a close correlation between the thickness of the luminescence conversion material layer and the resulting transmittance and conversion efficiency of the resulting LED device.

While embodiments of the invention have been particularly shown and described with references to preferred embodiments thereof, it will be understood by those skilled in the art that various changes in form and details may be made herein without departing from the spirit and scope of the invention as defined by the appended claims.

What is claimed is:

1. A method of forming an LED semiconductor device comprising:
   providing an LED on a substrate;
   providing a first encapsulant material layer on the LED;
   first annealing the first encapsulant material layer;
   providing a luminescence conversion material layer on the firstly annealed first encapsulant material layer, wherein the first encapsulant material layer is sufficiently hardened by the first annealing such that the luminescence conversion material layer does not penetrate substantially into the first encapsulant material layer;
   second annealing the first encapsulant material layer and the luminescence conversion material layer; and
   selectively removing a portion of the luminescence conversion material layer after providing the luminescence conversion material layer on the firstly annealed first encapsulant material layer, wherein selectively removing removes the portion of the luminescence conversion material layer that is not adhered to the firstly annealed first encapsulant material layer.

2. The method of claim 1 wherein the luminescence conversion material layer consists essentially of a luminescence conversion material.

3. The method of claim 1 wherein providing the luminescence conversion material layer on the firstly annealed first encapsulant material layer comprises providing the luminescence conversion material layer to a thickness that is selected to determine a resultant transmittance of optical energy that is emitted from the LED semiconductor device.

4. The method of claim 1 further comprising controlling a thickness of the luminescence conversion material layer by controlling process conditions of the first annealing of the first encapsulant material layer.

5. The method of claim 1 further comprising controlling a thickness of the luminescence conversion material layer by applying a physical pressure to the first encapsulant material layer.

6. The method of claim 1 wherein the first annealing is performed under first process conditions, and wherein the second annealing is performed under second process conditions, and wherein the second process conditions are independent of the first process conditions.

7. The method of claim 6 wherein the first process conditions of the first annealing result in a soft curing of the first encapsulant material layer and wherein the second process conditions of the second annealing result in a hard curing of the first encapsulant material layer.

8. The method of claim 1 further comprising providing a second encapsulant material layer on the luminescence conversion material layer.

9. The method of claim 8 wherein the second encapsulant material layer is substantially transparent to optical energy at wavelengths emitted by the LED.

10. The method of claim 8 wherein providing a second encapsulant material layer on the luminescence conversion material layer occurs prior to second annealing the first encapsulant material layer and the luminescence conversion material layer.

11. The method of claim 8 wherein providing a second encapsulant material layer on the luminescence conversion material layer occurs after second annealing the first encapsulant material layer and the luminescence conversion material layer.

12. The method of claim 1 wherein the first encapsulant material layer is substantially transparent to optical energy at wavelengths emitted by the LED.

13. The method of claim 1 further comprising providing a filter on the luminescence conversion material layer.

14. The method of claim 1 further comprising providing one or more lenses on the luminescence conversion material layer.

15. The method of claim 1 wherein providing a first encapsulant material layer on the LED further comprises providing a first encapsulant material layer on the substrate.

16. A method of forming an LED semiconductor device comprising:
   providing an LED on a substrate;
   providing a first encapsulant material layer on the LED;
   first annealing the first encapsulant material layer;
   providing a luminescence conversion material layer on the firstly annealed first encapsulant material layer, wherein the first encapsulant material layer is sufficiently hardened by the first annealing such that the luminescence conversion material layer does not penetrate substantially into the first encapsulant material layer;

second annealing the first encapsulant material layer and the luminescence conversion material layer,
wherein providing a first encapsulant material layer on the LED further comprises providing the first encapsulant material layer exclusively on the LED and the substrate and patterning the first encapsulant material so that the first encapsulant material remains exclusively on the LED, and
wherein providing the luminescence conversion material layer on the firstly annealed first encapsulant material layer further comprises providing the luminescence conversion material layer on the substrate; and further comprising:
selectively removing a portion of the luminescence conversion material layer after providing the luminescence conversion material layer on the firstly annealed first encapsulant material layer and the substrate, wherein selectively removing removes the portion of the luminescence conversion material layer that is not adhered to the firstly annealed first encapsulant material layer.

17. The method of claim 16 further comprising providing a second encapsulant layer on the luminescence conversion material layer and on the substrate.

18. The method of claim 17 further comprising shaping the second encapsulation layer to have a convex or concave shape.

19. The method of claim 17 further comprising providing a filter on the second encapsulation layer.

20. The method of claim 1 wherein luminescence conversion material of the luminescence conversion material layer comprises a phosphor material.

21. A method of forming an LED semiconductor device comprising:
providing an LED on a substrate;
providing a first encapsulant material layer on the LED;
first annealing the first encapsulant material layer;
providing a luminescence conversion material layer on the firstly annealed first encapsulant material layer;
second annealing the first encapsulant material layer and the luminescence conversion material layer; and
selectively removing a portion of the luminescence conversion material layer after providing the luminescence conversion material layer on the firstly annealed first encapsulant material layer, wherein selectively removing removes the portion of the luminescence conversion material layer that is not adhered to the firstly annealed first encapsulant material layer.

22. The method of claim 21 wherein the luminescence conversion material layer consists essentially of a luminescence conversion material.

23. The method of claim 21 wherein providing the luminescence conversion material layer on the firstly annealed first encapsulant material layer comprises providing the luminescence conversion material layer to a thickness that is selected to determine a resultant transmittance of optical energy that is emitted from the LED semiconductor device.

24. The method of claim 21 further comprising controlling a thickness of the luminescence conversion material layer by controlling process conditions of the first annealing of the first encapsulant material layer.

25. The method of claim 21 further comprising controlling a thickness of the luminescence conversion material layer by applying a physical pressure to the first encapsulant material layer.

26. The method of claim 21 wherein the first annealing is performed under first process conditions, and wherein the second annealing is performed under second process conditions, and wherein the second process conditions are independent of the first process conditions.

27. The method of claim 26 wherein the first process conditions of the first annealing result in a soft curing of the first encapsulant material layer and wherein the second process conditions of the second annealing result in a hard curing of the first encapsulant material layer.

28. The method of claim 21 further comprising providing a second encapsulant material layer on the luminescence conversion material layer.

29. The method of claim 28 wherein the second encapsulant material layer is substantially transparent to optical energy at wavelengths emitted by the LED.

30. A method of forming an LED semiconductor device comprising:
providing an LED on a substrate;
providing a first encapsulant material layer on the LED;
first annealing the first encapsulant material layer;
providing a luminescence conversion material layer on the firstly annealed first encapsulant material layer;
second annealing the first encapsulant material layer and the luminescence conversion material layer,
wherein providing a first encapsulant material layer on the LED further comprises providing the first encapsulant material layer exclusively on the LED and the substrate and patterning the first encapsulant material so that the first encapsulant material remains exclusively on the LED, and
wherein providing the luminescence conversion material layer on the firstly annealed first encapsulant material layer further comprises providing the luminescence conversion material layer on the substrate; and further comprising:
selectively removing a portion of the luminescence conversion material layer after providing the luminescence conversion material layer on the firstly annealed first encapsulant material layer and the substrate, wherein selectively removing removes the portion of the luminescence conversion material layer that is not adhered to the firstly annealed first encapsulant material layer.

31. The method of claim 30 wherein the luminescence conversion material layer consists essentially of a luminescence conversion material.

32. The method of claim 30 wherein providing the luminescence conversion material layer on the firstly annealed first encapsulant material layer comprises providing the luminescence conversion material layer to a thickness that is selected to determine a resultant transmittance of optical energy that is emitted from the LED semiconductor device.

33. The method of claim 30 further comprising controlling a thickness of the luminescence conversion material layer by controlling process conditions of the first annealing of the first encapsulant material layer.

34. The method of claim 30 further comprising controlling a thickness of the luminescence conversion material layer by applying a physical pressure to the first encapsulant material layer.

35. The method of claim 30 wherein the first annealing is performed under first process conditions, and wherein the second annealing is performed under second process conditions, and wherein the second process conditions are independent of the first process conditions.

36. The method of claim 35 wherein the first process conditions of the first annealing result in a soft curing of the first encapsulant material layer and wherein the second process conditions of the second annealing result in a hard curing of the first encapsulant material layer.

37. The method of claim 30 further comprising providing a second encapsulant material layer on the luminescence conversion material layer.

38. The method of claim 37 wherein the second encapsulant material layer is substantially transparent to optical energy at wavelengths emitted by the LED.

* * * * *